United States Patent
Wang et al.

(10) Patent No.: US 12,272,613 B2
(45) Date of Patent: Apr. 8, 2025

(54) THERMAL STRUCTURE FOR SEMICONDUCTOR DEVICE AND METHOD OF FORMING THE SAME

(71) Applicant: Taiwan Semiconductor Manufacturing Co., Ltd., Hsinchu (TW)

(72) Inventors: Wei-Ming Wang, Taichung (TW); Yu-Hung Lin, Taichung (TW); Shih-Peng Tai, Xinpu Township (TW); Kuo-Chung Yee, Taoyuan (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 390 days.

(21) Appl. No.: 17/861,556

(22) Filed: Jul. 11, 2022

(65) Prior Publication Data

US 2024/0014091 A1    Jan. 11, 2024

(51) Int. Cl.
*H01L 29/15* (2006.01)
*H01L 23/00* (2006.01)
(Continued)

(52) U.S. Cl.
CPC .......... *H01L 23/367* (2013.01); *H01L 23/481* (2013.01); *H01L 24/08* (2013.01);
(Continued)

(58) Field of Classification Search
CPC ..... H01L 23/367; H01L 23/481; H01L 24/08; H01L 25/0657; H01L 23/3675; H01L 24/05; H01L 24/29; H01L 24/32; H01L 24/80; H01L 2224/0557; H01L 2224/05624; H01L 2224/05647; H01L 2224/06181; H01L 2224/08145; H01L 2224/08245; H01L 2224/29193; H01L 2224/2929; H01L 2224/29393; H01L 2224/32245; H01L 2224/80896; H01L 2225/06589; H01L 24/13; H01L 2224/0401; H01L 2224/16145; H01L 2224/73253; H01L 23/49827; H01L 2225/06541; H01L 2224/32145; H01L 25/0655; H01L 25/0652; H01L 2225/06517; H01L 2924/13091; H01L 27/088; H01L 23/5386; H01L 21/486; H01L 2225/06544; H01L 2224/04105;
(Continued)

(56) References Cited

U.S. PATENT DOCUMENTS 8,993,380 B2    3/2015    Hou et al.
9,281,254 B2    3/2016    Yu et al.
(Continued)

*Primary Examiner* — Niki H Nguyen
(74) *Attorney, Agent, or Firm* — Slater Matsil, LLP

(57) ABSTRACT

A semiconductor device includes an integrated circuit structure and a thermal pillar over the integrated circuit structure. The integrated circuit structure includes a semiconductor substrate including circuitry, a dielectric layer over the semiconductor substrate, an interconnect structure over the dielectric layer, and a first thermal fin extending through the semiconductor substrate, the dielectric layer, and the interconnect structure. The first thermal fin is electrically isolated from the circuitry. The thermal pillar is thermally coupled to the first thermal fin.

20 Claims, 25 Drawing Sheets

(51) Int. Cl.
*H01L 23/367* (2006.01)
*H01L 23/48* (2006.01)
*H01L 25/065* (2023.01)
*H01L 31/0312* (2006.01)

(52) U.S. Cl.
CPC ...... *H01L 25/0657* (2013.01); *H01L 23/3675* (2013.01); *H01L 24/05* (2013.01); *H01L 24/29* (2013.01); *H01L 24/32* (2013.01); *H01L 24/80* (2013.01); *H01L 2224/0557* (2013.01); *H01L 2224/05624* (2013.01); *H01L 2224/05647* (2013.01); *H01L 2224/06181* (2013.01); *H01L 2224/08145* (2013.01); *H01L 2224/08245* (2013.01); *H01L 2224/29193* (2013.01); *H01L 2224/2929* (2013.01); *H01L 2224/29393* (2013.01); *H01L 2224/32245* (2013.01); *H01L 2224/80896* (2013.01); *H01L 2225/06589* (2013.01)

(58) Field of Classification Search
CPC ....... H01L 23/5384; H01L 2224/81203; H01L 21/4871; H01L 2225/06548; H01L 23/485; H01L 2224/16238; H01L 2224/81193; H01L 24/49; H01L 33/62; H01L 23/522; H01L 23/3672; H01L 2924/18162; H01L 2224/81191; H01L 2224/83191; H01L 2224/48137; H01L 2224/05569; H01L 2224/17519; H01L 2224/13025; H01L 2221/6834; H01L 2224/81005; H01L 2224/7555; H01L 2224/92244; H01L 2224/80801; H01L 2224/80894; H01L 2224/81801; H01L 2224/8322

See application file for complete search history.

(56) References Cited

U.S. PATENT DOCUMENTS

| | | | |
|---|---|---|---|
| 9,299,649 | B2 | 3/2016 | Chiu et al. |
| 9,372,206 | B2 | 6/2016 | Wu et al. |
| 9,425,126 | B2 | 8/2016 | Kuo et al. |
| 9,443,783 | B2 | 9/2016 | Lin et al. |
| 9,461,018 | B1 | 10/2016 | Tsai et al. |
| 9,496,189 | B2 | 11/2016 | Yu et al. |
| 9,666,502 | B2 | 5/2017 | Chen et al. |
| 9,735,131 | B2 | 8/2017 | Su et al. |
| 9,768,149 | B2 * | 9/2017 | Vadhavkar .......... H01L 23/3157 |
| 9,865,570 | B1 * | 1/2018 | England .................. H01L 24/17 |
| 2011/0186990 | A1 * | 8/2011 | Mawatari .............. H01L 23/481 257/737 |
| 2013/0299950 | A1 * | 11/2013 | Hummler ............ H01L 23/3677 438/459 |
| 2015/0235949 | A1 * | 8/2015 | Yu ....................... H01L 25/0652 257/774 |
| 2017/0062383 | A1 * | 3/2017 | Yee ........................ H01L 24/09 |
| 2018/0026067 | A1 * | 1/2018 | Lee ........................ H01L 24/19 257/777 |
| 2018/0074111 | A1 | 3/2018 | Chen et al. |
| 2019/0198489 | A1 * | 6/2019 | Kim ..................... H01L 23/481 |
| 2019/0326199 | A1 | 10/2019 | Lin et al. |
| 2021/0327807 | A1 | 10/2021 | Chen et al. |
| 2022/0208725 | A1 | 6/2022 | Chen et al. |
| 2022/0216146 | A1 | 7/2022 | Chen et al. |
| 2023/0352418 | A1 * | 11/2023 | Lin ..................... H01L 23/5383 |

* cited by examiner

THERMAL STRUCTURE FOR SEMICONDUCTOR DEVICE AND METHOD OF FORMING THE SAME

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
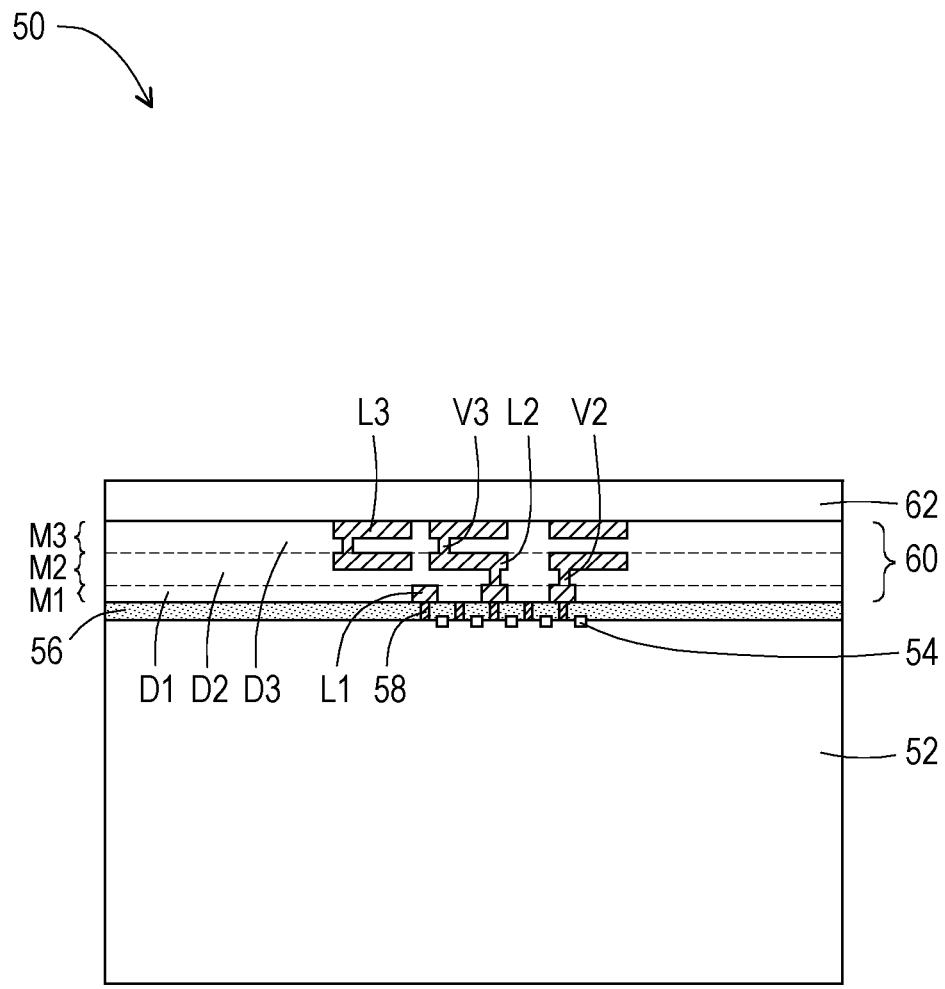
FIG. 1 illustrates a cross-sectional view of an integrated circuit structure, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

According to various embodiments, thermal fins are integrated with semiconductor structures such as 2D integrated circuits, 2.5D integrated circuits, 3D integrated circuits (3DICs), or system-on-integrated chips (SoICs) to improve heat dissipation. The thermal fins may have similar structures as through vias (TVs) of the semiconductor structures, and may be formed using similar processes as the TVs. The thermal fins provide high heat dissipation efficiency and are compatible with other heat dissipation solutions such as thermal vias and metal pillars. The fin structures of the thermal fins may provide greater heat dissipation than narrow pillar shapes of TVs.

FIG. 1 illustrates a cross-sectional view of an integrated circuit structure 50 in accordance with some embodiments. The integrated circuit structure 50 may be a die, a wafer, or the like. For example, in embodiments where the integrated circuit structure 50 is a die, the integrated circuit structure 50 may be a logic die (e.g., central processing unit (CPU), graphics processing unit (GPU), system-on-a-chip (SoC), application processor (AP), microcontroller, etc.), a memory die (e.g., dynamic random access memory (DRAM) die, static random access memory (SRAM) die, etc.), a power management die (e.g., power management integrated circuit (PMIC) die), a radio frequency (RF) die, a sensor die, a micro-electro-mechanical-system (MEMS) die, a signal processing die (e.g., digital signal processing (DSP) die), a front-end die (e.g., analog front-end (AFE) dies), the like, or combinations thereof.

In embodiments where the integrated circuit structure 50 is a die, the integrated circuit structure 50 may be formed in a wafer, which may include different device regions that are singulated in subsequent steps to form a plurality of integrated circuit dies. The integrated circuit structure 50 may be processed according to applicable manufacturing processes to form integrated circuits. For example, the integrated circuit structure 50 includes a semiconductor substrate 52, such as silicon, doped or undoped, or an active layer of a semiconductor-on-insulator (SOI) substrate. The semiconductor substrate 52 may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. The semiconductor substrate 52 has an active surface (e.g., the surface facing upwards in FIG. 1), sometimes called a front side, and an inactive surface (e.g., the surface facing downwards in FIG. 1), sometimes called a back side.

Devices 54 are formed at the active surface of the semiconductor substrate 52. For the purpose of illustration, FIG. 1 illustrates a transistor, but the devices 54 may be other active devices or passive devices. For example, the electrical components may be transistors, diodes, capacitors, resistors, or the like, formed by any suitable formation method. The devices 54 may be interconnected to form, for example, memory devices or logic devices on the integrated circuit structure 50.

One or more inter-layer dielectric (ILD) layer(s) 56 are formed on the semiconductor substrate 52, and electrically conductive features, such as conductive plugs 58, are formed physically and electrically coupled to the devices 54. The ILD layer(s) 56 may be formed of any suitable dielectric material, for example, an oxide such as silicon oxide, phosphosilicate glass (PSG), borosilicate glass (BSG), boron-doped phosphosilicate glass (BPSG), or the like; a nitride such as silicon nitride; or the like. The ILD layer(s) 56 may be formed by any suitable method, such as CVD, physical vapor deposition (PVD), ALD, PEALD, PECVD, SACVD, FCVD, spin-on, and/or the like, or a combination thereof.

Conductive plugs 58 extend through the ILD layer(s) 56 to electrically and physically couple the devices 54. For example, when the devices 54 are transistors, the conductive plugs 58 may couple the gates and source/drain region(s) of the transistors. Source/drain region(s) may refer to a source or a drain, individually or collectively dependent upon the context. The conductive plugs 58 may be formed of tungsten, cobalt, nickel, copper, silver, gold, aluminum, the like, or combinations thereof. The conductive plugs 58 may be formed through any suitable process, such as deposition, damascene (e.g., single damascene, dual damascene, etc.), the like, or combinations thereof.

An interconnect structure 60 is over the ILD layer(s) 56 and conductive plugs 58. The interconnect structure 60 interconnects the devices 54 to form paths for electrical signals or circuitry. The interconnect structure 60 may be formed by, for example, metallization layers including metallization patterns formed in dielectric layers on the ILD layer(s) 56. The metallization patterns include conductive lines and vias formed in one or more intermetal dielectric (IMD) layers. In addition to providing insulation between various conductive elements, an IMD layer may include one or more dielectric etch stop layers (not individually shown) to control the etching processes that form openings in the IMD layer. Generally, vias conduct current vertically and are used to electrically connect two conductive features located at vertically adjacent levels, whereas lines conduct current laterally and are used to distribute electrical signals and power within one level.

Although three metallization layers M1, M2, and M3 are illustrated in FIG. 1, it should be appreciated that more or less metallization layers may be formed. Each of the metallization layers M1, M2, and M3 includes metallization patterns in dielectric layers. The metallization patterns of the interconnect structure 60 are electrically coupled to the devices 54 by the conductive plugs 58, and include, respectively, metal lines L1-L3 and vias V2 and V3 formed in one or more inter-metal dielectric (IMD) layers D1-D3. The interconnect structure 60 may be formed by a damascene process, such as a single damascene process, a dual damascene process, the like, or a combination thereof. In embodiments illustrated in accordance with FIG. 1, conductive lines L1 connect conductive plugs 58 to conductive vias V2 and, at subsequent levels, vias connect lines on a level below the vias to lines above the vias (e.g., a pair of lines can be connected by a via). Some embodiments may adopt a different scheme. For example, conductive vias may be in the metallization layer M1 between the conductive plugs 58 and the conductive lines L1. In some embodiments, the conductive plugs 58 are formed through the ILD layer(s) 56 during the formation of the metallization layer M1.

Still referring to FIG. 1, the metallization layer M1 may be formed using, for example, a damascene process flow. First, a dielectric stack used to form an IMD layer D1 may be deposited using one or more layers of the dielectric materials listed above with respect to the description of the ILD layer(s) 56. The techniques used to deposit the dielectric stack for the IMD layer D1 may be the same or similar as those used in forming the ILD layer(s) 56.

Appropriate photolithography and etching techniques (e.g., anisotropic RIE employing fluorocarbon chemicals) may be used to pattern the IMD layer D1 to form openings for lines. Several conductive materials may be deposited to fill the trenches forming the conductive lines L1 of the metallization layer M1. For example, the openings may be first lined with one or more liners and then filled with a conductive fill layer. A conductive diffusion barrier liner may be formed over sidewalls and bottom surfaces of the trenches. Any excess conductive material over the IMD layer D1 outside of the openings may be removed by a planarizing process (e.g., a CMP) thereby forming a top surface comprising dielectric regions of the IMD layer D1 that are substantially coplanar with conductive regions of conductive lines L1. The planarization step completes fabrication of the metallization layer M1 comprising conductive lines L1 embedded in the IMD layer D1, as illustrated in FIG. 1.

Still referring to FIG. 1, the metallization layer M2 is formed on the metallization layer M1 using, for example, a dual damascene process flow. First, a dielectric stack used to form IMD layer D2 is formed using similar materials and methods as described above with respect to IMD layer D1. Next, openings for vias V2 and lines L2 are formed in the IMD layer D2 with appropriate photolithography and etching techniques. The openings for the vias V2 may be vertical holes extending through the IMD layer D2 to expose a top conductive surface of the conductive lines M1, and the openings for the lines L2 may be longitudinal trenches formed in an upper portion of the IMD layer D2. The openings may be formed using either a via-first process or a via-last process.

Several conductive materials may be deposited to fill the holes and trenches forming the conductive vias V2 and conductive lines L2 of the metallization layer M2. The conductive vias V2 and conductive lines L2 may be formed using similar materials and methods as described above for the conductive lines L1. Any excess conductive material over the IMD layer D2 outside of the openings may be removed by a planarizing process (e.g., CMP) thereby forming a top surface comprising dielectric regions of IMD layer D2 that are substantially coplanar with conductive regions of the metallization layer M2. The planarization step embeds the conductive vias V2 and conductive lines L2 into IMD layer D2, as illustrated in FIG. 1.

Further referring to FIG. 1, the metallization layer M3 is formed on the metallization layer M2. The metallization layer M3 includes conductive lines L3 and vias V3 embedded in an IMD layer D3. The metallization layer M3 may be formed using similar materials and methods as described above with respect to the metallization layer M2. The conductive lines L3 may be coupled to the conductive lines L2 of the metallization layer M2 through the vias V3.

Although example devices 54 and example interconnect structure 60 making connections to the electronic devices 54 are described, it is understood that one of ordinary skill in the art will appreciate that the above examples are provided for illustrative purposes only to further explain applications of the present embodiments, and are not meant to limit the present embodiments in any manner.

Following the formation of the interconnect structure 60, a dielectric layer 62 is formed over the interconnect structure 60. The dielectric layer 62 may be subsequently used to form a top metallization layer over the interconnect structure 60

(see below, FIG. 2A) that provides electrical connection between the interconnect structure 60 and other features (e.g., contact pads and external connectors) subsequently formed over the dielectric layer 62. The dielectric layer 62 may be formed using similar materials and methods as described above with respect to the ILD layer(s) 56.

In some embodiments, the integrated circuit structure 50 is a stacked device that includes multiple semiconductor substrates 52. For example, the integrated circuit structure 50 may be a memory device such as a hybrid memory cube (HMC) module, a high bandwidth memory (HBM) module, or the like that includes multiple memory dies. In such embodiments, the integrated circuit structure 50 includes multiple semiconductor substrates 52 interconnected by through vias (TVs). Each of the semiconductor substrates 52 may (or may not) have an interconnect structure 60.

FIGS. 2A-11 follow from FIG. 1 and illustrate intermediate steps in the fabrication of thermal fins 66 in the integrated circuit structure 50 and the attachment of the integrated circuit structure 50 to one or more die(s) and one or more thermal pillar(s) in a face-to-back (F2B) stacking to form a bonded semiconductor structure, in accordance with some embodiments.

FIGS. 2A-3E illustrate the formation of thermal fins 66 in the integrated circuit structure 50, in accordance with some embodiments. The thermal fins 66 may be formed using similar methods and materials as through vias (TVs) 64 formed in the integrated circuit structure 50. As such, the formation of the thermal fins 66 may be integrated with process flows for the formation of TVs, which may reduce design and production costs. The thermal fins 66 may provide increased and/or additional heat dissipation efficiency over the narrower pillar shapes of the TVs 64. The thermal fins 66 may subsequently be coupled with other heat dissipation solutions such as thermal vias and metal pillars (see below, FIG. 9).

Figure 2A:
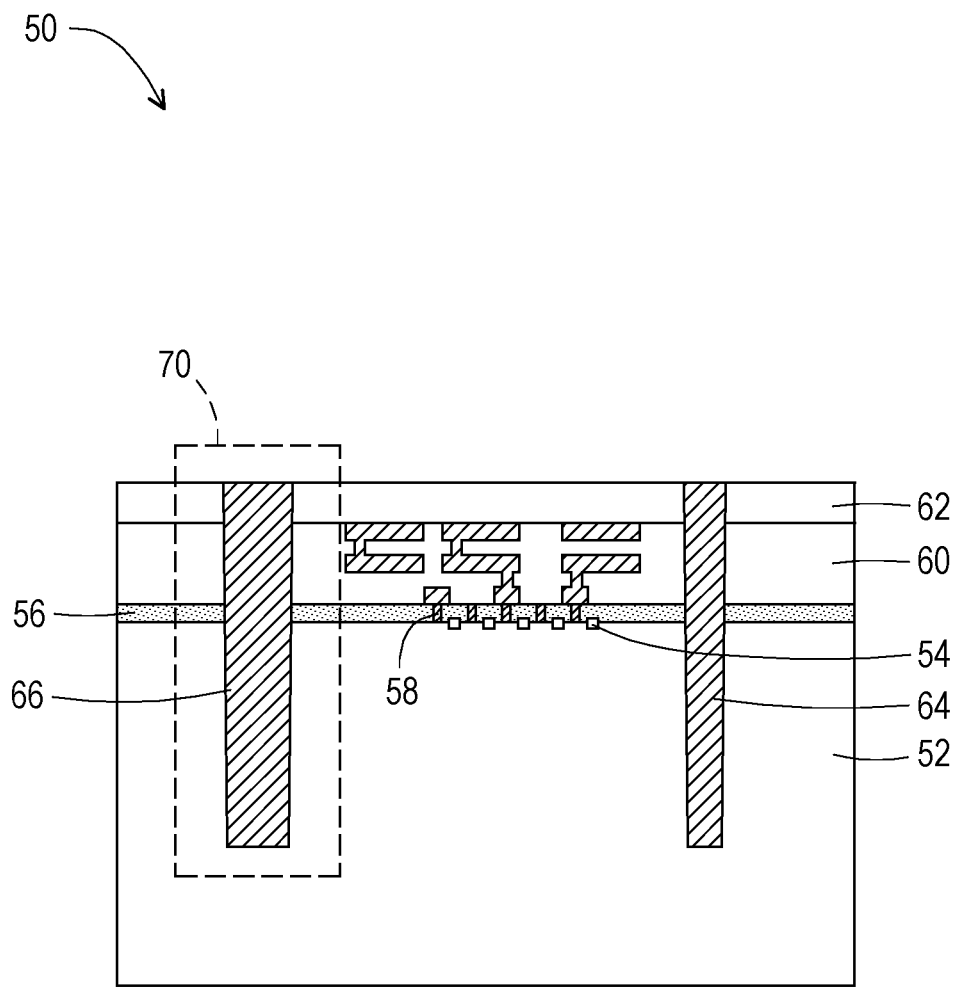
FIGS. 2A-2G, 3A-3E, 4-9, 10A, 10B, and 11 illustrate cross-sectional and top views of intermediate steps during a process for forming a bonded semiconductor structure, in accordance with some embodiments.
Figure 2B:
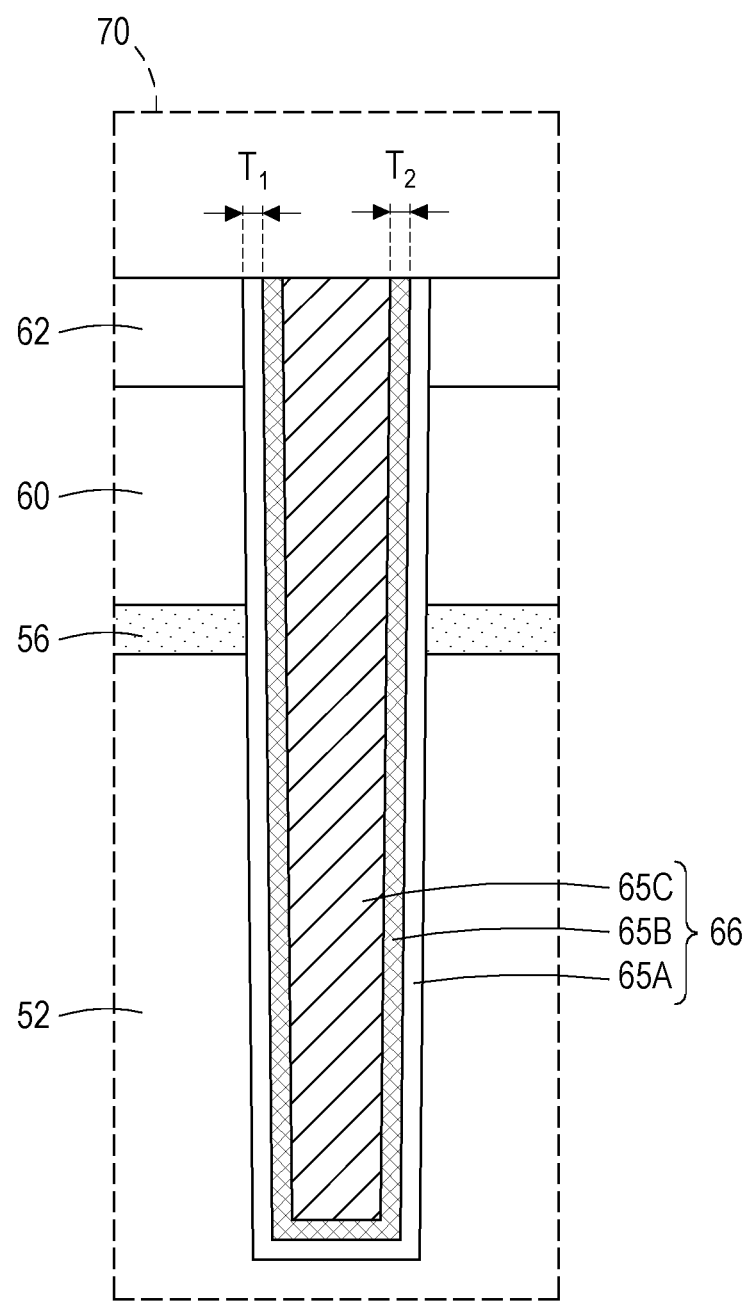

FIG. 2A illustrates a cross-sectional view of the integrated circuit structure 50 showing the formation of a TV 64 and thermal fins 66. FIG. 2B illustrates a detailed cross-sectional view of a thermal fin 66 in region 70 illustrated in FIG. 2A. FIGS. 2C-2F illustrate top views of region 70 for embodiments of thermal fins 66.

In FIGS. 2A and 2B, TVs 64 and thermal fins 66 are formed through the dielectric layer 62, the interconnect structure 60, the ILD layer(s) 56, and are formed extending into the semiconductor substrate 52. FIG. 2B illustrates a detailed view of region 70 shown in FIG. 2A. The TVs 64 can be used for electrical connection of devices subsequently attached to the integrated circuit structure 50, and the thermal fins 66 may provide increased heat dissipation efficiency for the integrated circuit structure 50 and other devices or structures attached to it (see below, FIG. 9). The thermal fins 66 may be dummy or inactive features, e.g., the thermal fins are not electrically connected in order to transmit electrical signals for circuitry. In some embodiments, the thermal fins 66 are electrically isolated from conductive features of the interconnect structure 60, so that the thermal fins 66 are not electrically connected to the active devices 54. The thermal fins 66 will subsequently be thermally coupled to external features such as thermal pillars (see below, FIG. 9) to conduct heat out of the integrated circuit structure 50. In some embodiments, the TVs 64 and the thermal fins 66 are formed in the same process using the same methods and materials. The thermal fins 66 may have larger dimensions than the TVs 64 in order to provide greater heat dissipation efficiency.

As an example to form the TVs 64 and the thermal fins 66, recesses can be formed through the dielectric layer 62, the interconnect structure 60, the ILD layer(s) 56, and into the semiconductor substrate 52. The recesses may be formed by applying, exposing, and developing a suitable photoresist (not shown) over the dielectric layer 62 to define a desired pattern of TVs 64 and thermal fins 66. Additional masking layers may be used. One or more etching process may be used to remove portions of the dielectric layer 62, the interconnect structure 60, the ILD layer(s) 56, and into the semiconductor substrate 52 that are exposed to the desired depth. Other techniques, such as milling, laser techniques, a combination thereof, and/or the like, may also be used. The recesses may be formed so as to extend into the semiconductor substrate 52 at least further than the devices 54 formed within and/or on the semiconductor substrate 52. In some embodiments the recesses extend to a depth greater than the eventual desired height of the semiconductor substrate 52. In some embodiments, recesses formed for the TVs 64 are round holes and recesses formed for the thermal fins 66 are longitudinal trenches with, e.g., rectangular shapes in a top view.

Once the recesses have been formed within the semiconductor substrate 52, in some embodiments the recesses are lined with a liner 65A as illustrated in FIG. 2B. The liner 65A may be, e.g., an oxide formed from tetraethylorthosilicate (TEOS) or silicon nitride, although any suitable dielectric material may be used. The liner 66A may be formed using a plasma enhanced chemical vapor deposition (PECVD) process, although other suitable processes, such as physical vapor deposition or a thermal process, may alternatively be used. The liner 65A may have a thickness $T_1$ in a range of 5 nm to 500 nm.

Once the liner 65A has been formed along the sidewalls and bottom of the recesses, a barrier layer 65B may be conformally deposited in the recesses, such as by CVD, atomic layer deposition (ALD), physical vapor deposition (PVD), thermal oxidation, the like, or a combination thereof. The barrier layer 65B may be formed from an oxide, a nitride, or an oxynitride, such as titanium nitride, titanium oxynitride, tantalum nitride, tantalum oxynitride, tungsten nitride, a combination thereof, and/or the like. However, any suitable material for the barrier layer 65B may be used. In some embodiments, the barrier layer 65B is formed directly along the sidewalls and bottom of the recesses. The barrier layer 65B may have a thickness $T_2$ in a range of 5 nm to 500 nm.

After forming the barrier layer 65B, the remainder of the recesses may be filled with a first conductive material 65C so that the barrier layer 65B covers sidewalls of the first conductive material 65C. The first conductive material 65C comprises copper, tungsten, cobalt, aluminum, silver, gold, alloys, doped polysilicon, the like, or a combination thereof. The first conductive material 65C may be formed by deposition or by electroplating copper onto a seed layer (not shown), filling and overfilling the recesses. However, any suitable process such as CVD, PVD, or the like may be used. Once the recesses have been filled, excess portions of the liner 65A, barrier layer 65B, seed layer, and first conductive material 65C outside of the recesses may be removed through a planarization process such as chemical mechanical polishing (CMP), although any suitable removal process may be used. Remaining portions of the liner 65A, the barrier layer 65B, and the first conductive material 65C form the TVs 64 and the thermal fins 66.

The TVs 64 and the thermal fins 66 are illustrated as being formed of a same material having both good thermal and electrical conductivity properties, such as copper. In some embodiments, the TVs 64 and the thermal fins 66 may be formed of different materials, wherein the TVs 64 are formed of a material having good electrical characteristics and the thermal fins 66 are formed of a material having good thermal characteristics.

In some embodiments as illustrated in accordance with FIGS. 2A-2B, the TVs 64 and the thermal fins 66 are not yet exposed at a back side of the semiconductor substrate 52. Rather, the TVs 64 and the thermal fins 66 are buried in the semiconductor substrate 52. As will be discussed in greater detail below (see FIG. 5), the TVs 64 and the thermal fins 66 will be exposed at the back side of the semiconductor substrate 52 in subsequent processing. In some embodiments, the TVs 64 and the thermal fins 66 are formed through the semiconductor substrate 52. Sidewalls of the TVs 64 and the thermal fins 66 may be tapered as illustrated in FIGS. 2A-2B.

Figure 2D:
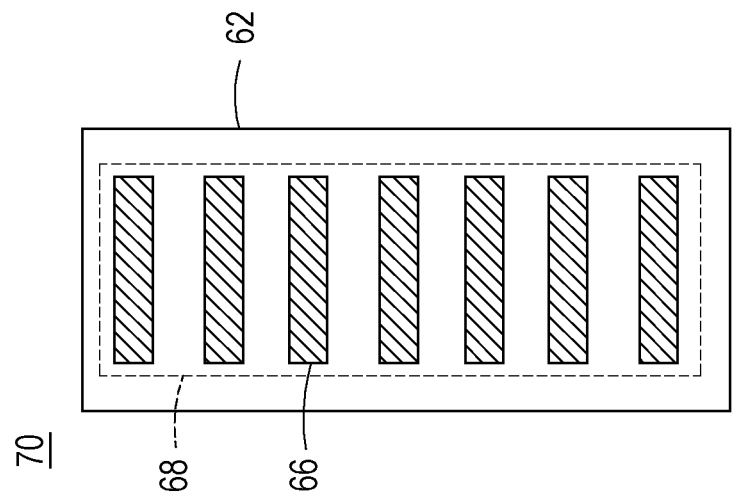
Figure 2C:
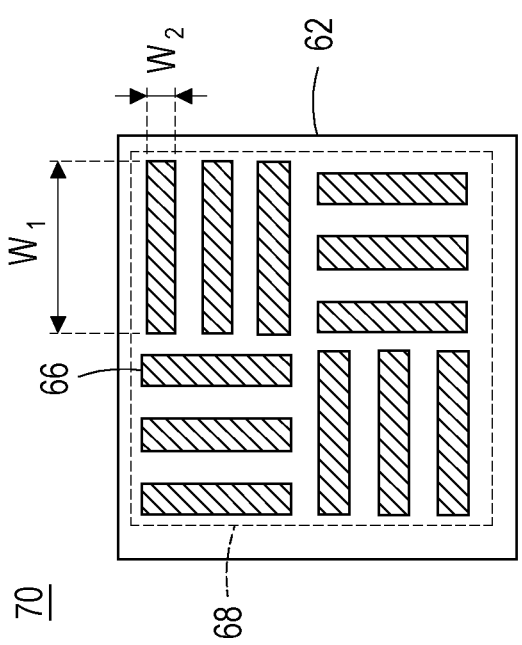

FIGS. 2C-2F illustrate top views of region 70 showing various arrangements for thermal fin arrays 68 of thermal fins 66, in accordance with some embodiments. FIG. 2C illustrates a thermal fin array 68 with a square arrangement of twelve thermal fins 66 in four groups of three parallel thermal fins 66. The thermal fins 66 of each group have respective longitudinal axes parallel to each other and perpendicular to respective longitudinal axes of thermal fins 66 in neighboring groups. In some embodiments, each group of thermal fins 66 have any suitable number of thermal fins 66 and are arranged parallel to, perpendicular to, or askew with thermal fins 66 in neighboring groups. In some embodiments, the groups of thermal fins 66 are arranged in rectangular patterns, round patterns, oval patterns, or any other suitable arrangement of groups of thermal fins 66. The thermal fins 66 may be formed in the same process steps, together with any TVs 64 (see above, FIG. 2A).

In some embodiments, the thermal fins 66 have rectangular shapes in a top view with a first width $W_1$ measured along longer top sides of the thermal fins 66 and a second width $W_2$ measured along shorter top sides of the thermal fins 66. The first width $W_1$ may be in a range of 0.4 μm to 40 μm, and the second width $W_2$ may be in a range of 0.1 μm to 10 μm. However, the thermal fins 66 may have any suitable shapes in a top view, such as square shapes, round shapes, oval shapes, triangular shapes, hexagonal shapes, other polygonal shapes, the like, or a combination thereof.

FIG. 2D illustrates a thermal fin array 68 with thermal fins 66 arranged in a column as seen in a top view. Although FIG. 2D illustrates seven thermal fins 66, any suitable number of thermal fins 66 may be formed in the thermal fin array 68. In some embodiments, multiple columns of thermal fins 66 are formed adjacent to each other.

Figure 2F:
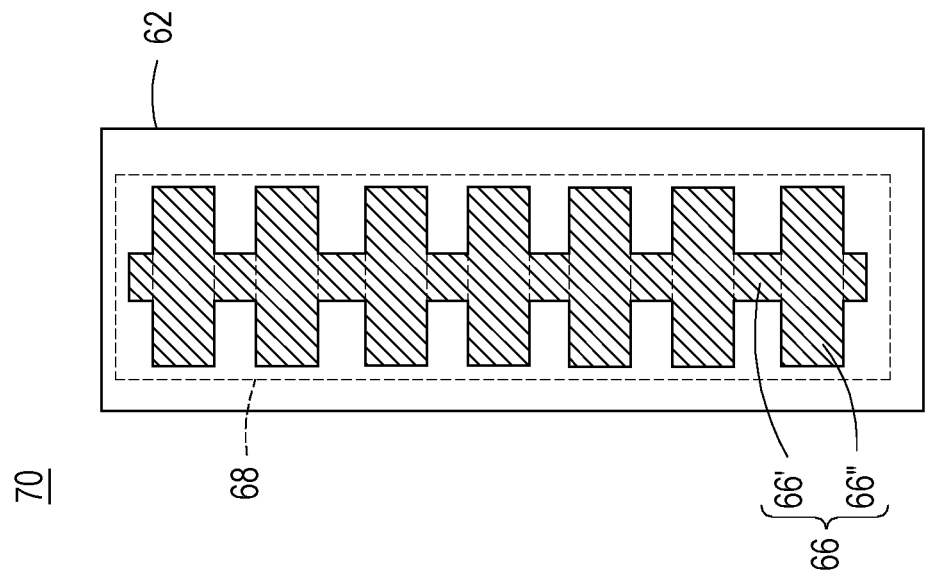
Figure 2E:
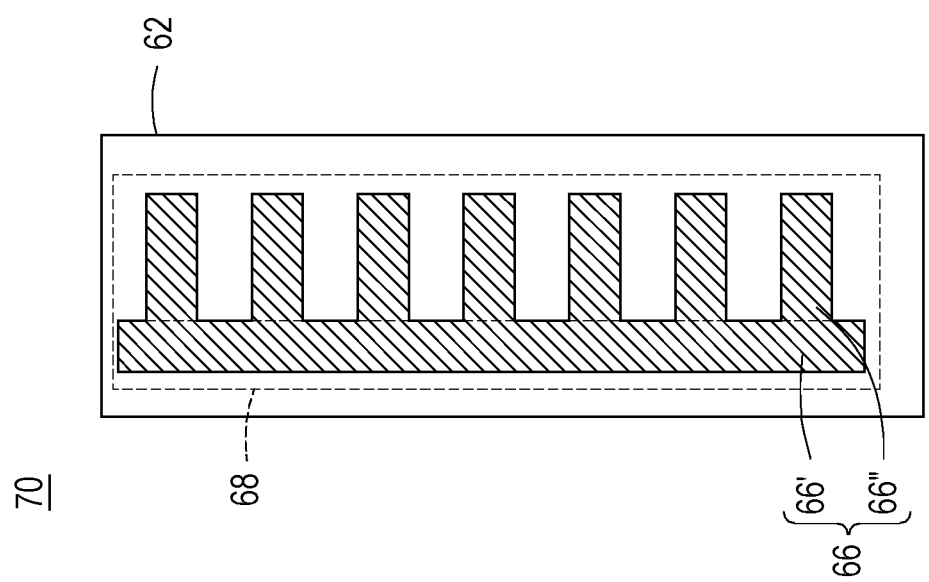

FIG. 2E illustrates a thermal fin array 68 in which a thermal fin 66 is arranged in a comb-like structure, with a connecting thermal portion 66' that connects thermal strips 66" (also referred to as finger-structures). For example, thermal strips 66" may extend from the connecting thermal portion 66'. Although FIG. 2E illustrates seven thermal strips 66", any suitable number of thermal strips 66" may be formed extending from the connecting thermal portion 66' in the thermal fin array 68. The connecting thermal portion 66' may increase heat dissipating efficiency of the thermal fin array 68.

FIG. 2F illustrates a thermal fin array 68 having a thermal fin 66 having thermal strips 66" arranged in a column as seen in a top view with connecting thermal portions 66' between neighboring thermal strips 66". The connecting thermal portions 66' may have smaller widths than the thermal strips 66" as seen in a top view. Although FIG. 2F illustrates seven thermal strips 66", any suitable number of thermal strips 66" may be formed in the thermal fin array 68. In some embodiments, the connecting thermal portions 66' intersect with respective middle portions of the column of the thermal strips 66' as seen in a top view. However, the connecting thermal portions 66' may be placed at any positions between adjacent ones of the thermal strips 66" of the thermal fin 66, and may not be aligned (e.g., staggered) with each other. The connecting thermal portions 66' may increase heat dissipating efficiency of the thermal fin array 68.

Figure 2G:
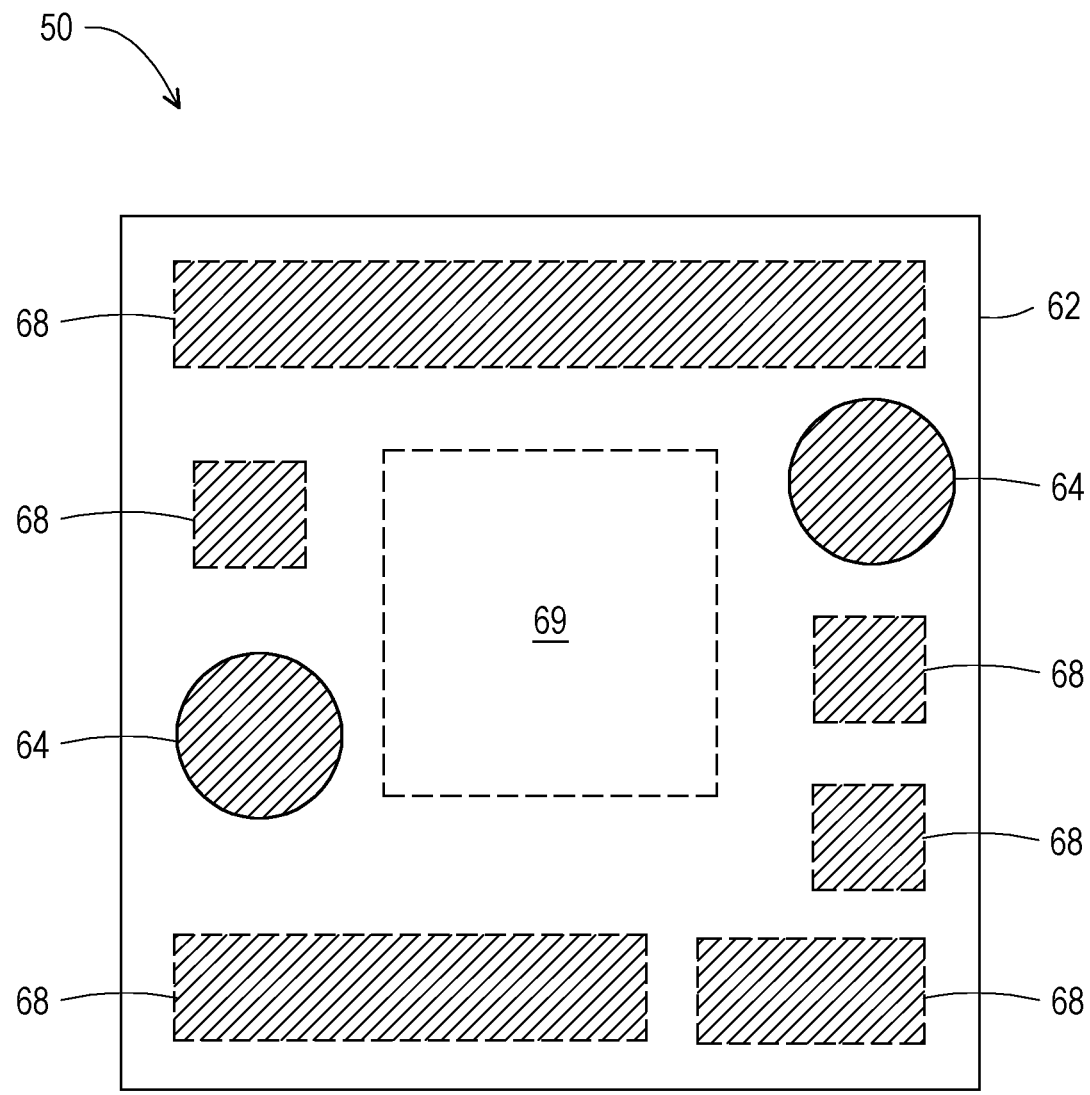

FIG. 2G illustrates an example top view of the integrated circuit structure 50, in accordance with some embodiments. A core region 69 is in the center of the integrated circuit structure 50 and overlies the conductive lines (e.g., conductive lines L3) of the interconnect structure 60 (see above, FIGS. 1 and 2A). Thermal fin arrays 68 and TVs 64 are arranged in the periphery of the integrated circuit structure 50, around the core region 69. The thermal fin arrays 68 may have any suitable arrangement of thermal fins 66, such as described above with respect to FIGS. 2C-2F. Although FIG. 2G illustrates two TVs 64 and six thermal fin arrays 68, the integrated circuit structure 50 may have any suitable numbers and arrangements of TVs 64 and thermal fin arrays 68. In some embodiments, one or more thermal fin arrays 68 or TVs 64 are present in the core region 69.

Figure 3A:
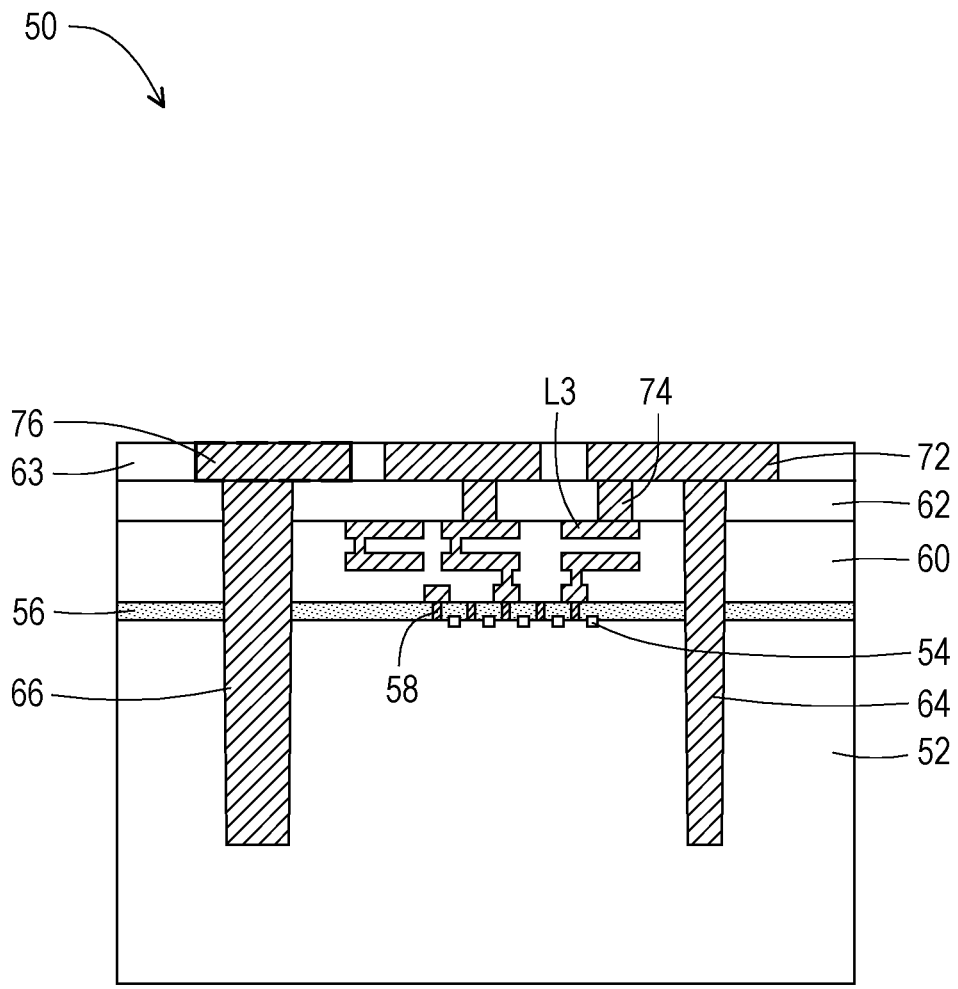

Next, in FIG. 3A, a dielectric layer 63 is formed over the dielectric layer 62, and conductive lines 72, conductive vias 74, and conductive features 76 (also referred to as metal cappings or a thermal capping layer) are formed in the dielectric layer 62 and the dielectric layer 63, in accordance with some embodiments. The dielectric layer 63 may be formed using similar methods and materials as described above for the dielectric layer 62 with respect to FIG. 1. The conductive lines 72, conductive vias 74, and conductive features 76 may provide electrical or thermal connection between conductive features of the interconnect structure 60 (e.g., conductive lines L3), TVs 64, and thermal fins 66 with subsequently formed or attached features.

The conductive features 76 are formed in the dielectric layer 63 to make thermal and physical contact with the thermal fins 66, the conductive vias 74 are formed in the dielectric layer 62 to make electrical and physical contact with conductive features of the interconnect structure 60 (e.g., conductive lines L3), and the conductive lines 72 are formed in the dielectric layer 63 to make electrical and physical contact with the TVs 64 and/or the conductive vias 74. The conductive features 76, conductive lines 72, and conductive vias 74 may be formed using similar materials and methods as the conductive lines L1, conductive vias V2, and conductive lines L2 (e.g., single or dual damascene processes) as described above with respect to FIG. 1.

Figure 3C:
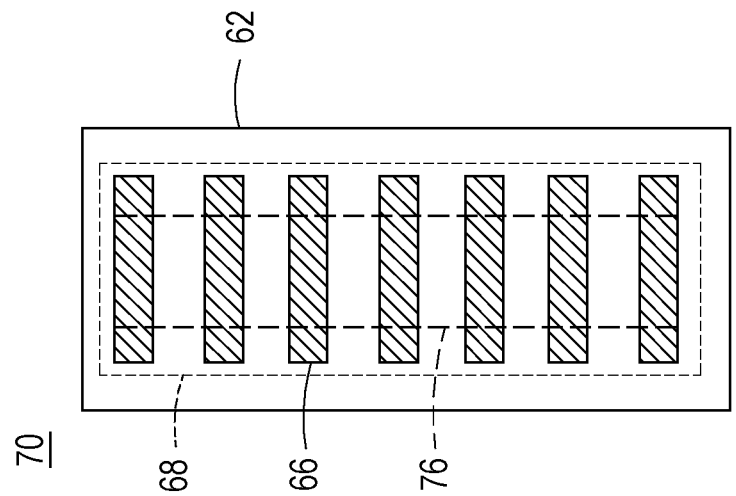
Figure 3B:
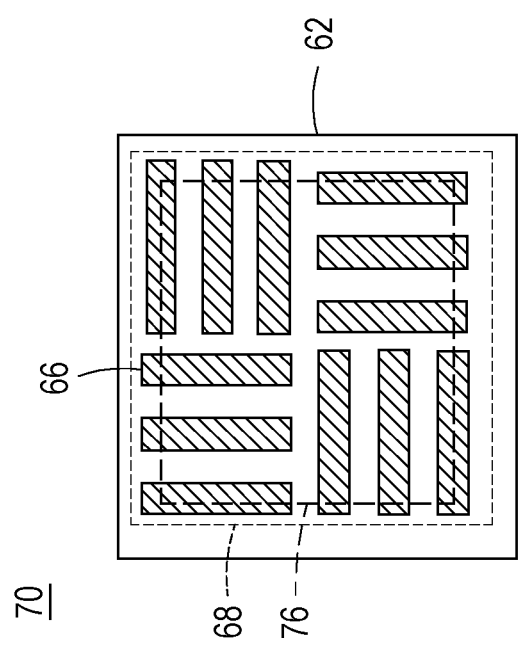

FIGS. 3B-3E illustrate plan views of region 70 (see above, FIG. 2A) at the level of top surfaces of thermal fins 66 showing various arrangements for thermal fin arrays 68 with conductive features 76 overlaying the thermal fin arrays 68, in accordance with some embodiments. The conductive features 76 may act as connecting pads to conduct heat out of the thermal fins 66, thereby increasing heat dissipation efficiency. In FIG. 3B, the conductive feature 76 has a square shape and extends over all thermal fins 66 of the thermal fin array 68. In FIG. 3C, the conductive feature 76 has a rectangular shape and extends over middle portions of all thermal fins 66 of the thermal fin array 68.

Figure 3E:
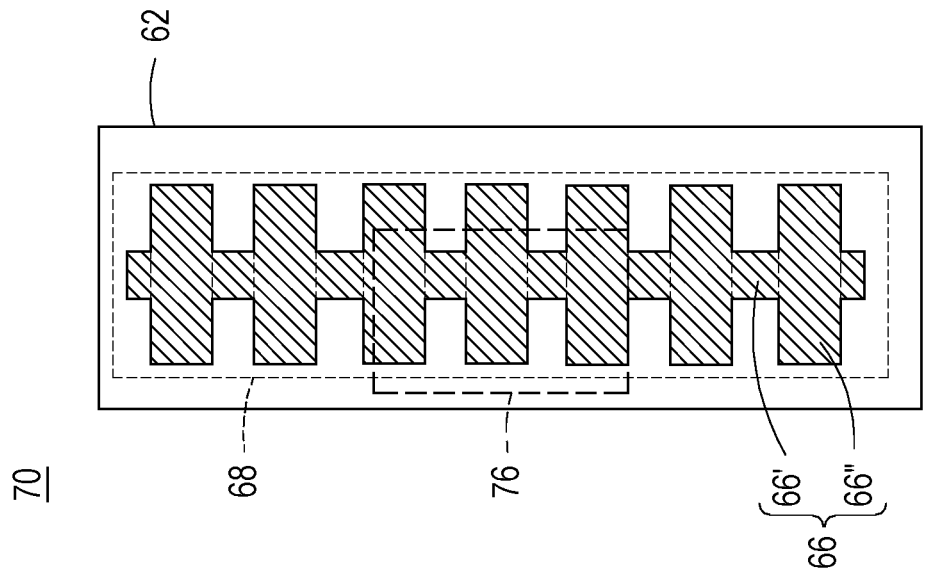
Figure 3D:
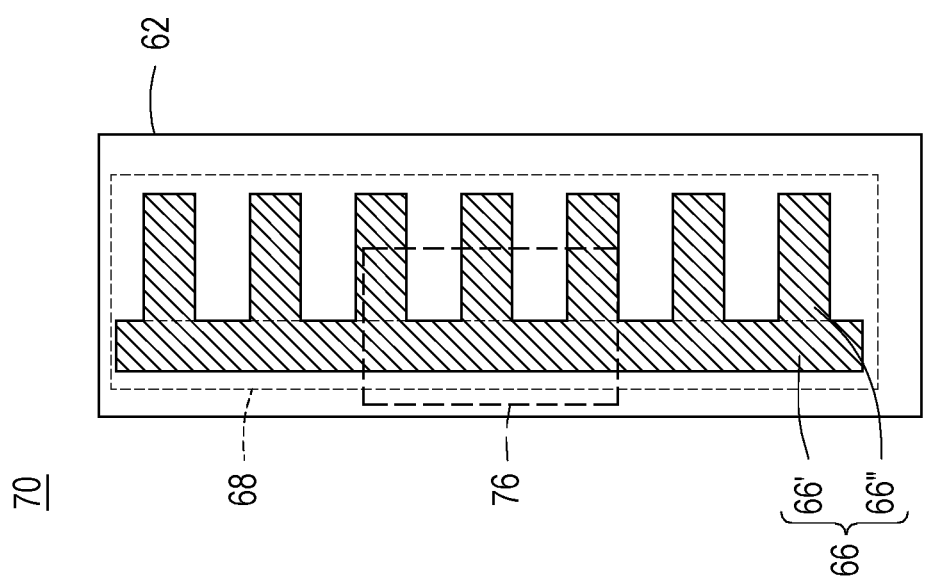

In FIG. 3D, the conductive feature 76 has a rectangular shape and extends over a middle portion of the connecting thermal portion 66' and left portions of some of the thermal strips 66" (e.g., three thermal strips 66" in the middle of the column of thermal strips 66"). Because the connecting thermal portion 66' thermally couples to all of the thermal strips 66" in the thermal fin array 68, the conductive feature 76 illustrated in FIG. 3D may physically contact the connecting thermal portion 66' and some of the thermal strips 66" while remaining free of physical contact with others of the thermal strips 66". In some embodiments, two or more conductive features 76 are formed to thermally couple with different thermal strips 66" and different portions of the connecting thermal portion 66'.

In FIG. 3E, the conductive feature 76 has a rectangular shape and extends over some of the thermal strips 66" (e.g., three thermal strips 66" in the middle of the column of thermal strips 66") and some of the connecting thermal fins 66'. Because the connecting thermal portions 66' thermally couple all of the thermal strips 66" in the thermal fin array 68 to each other, the conductive feature 76 illustrated in FIG. 3D may physically contact some of the thermal strips 66" and some of the connecting thermal portions 66' while remaining free of physical contact with others of the thermal strips 66" and the connecting thermal portions 66'. In some embodiments, two or more conductive features 76 are formed to thermally couple with different thermal strips 66" and different connecting thermal portions 66'.

The size and position of the conductive feature 76 is shown for illustrative purposes and may vary. For example, position of the conductive feature 76 as illustrated in FIGS. 3D and 3E may vary. As another example, the size of the conductive feature 76 as illustrated in FIGS. 3D and 3E may also vary to cover less, more, or all of the thermal fin array 68.

Figure 4:
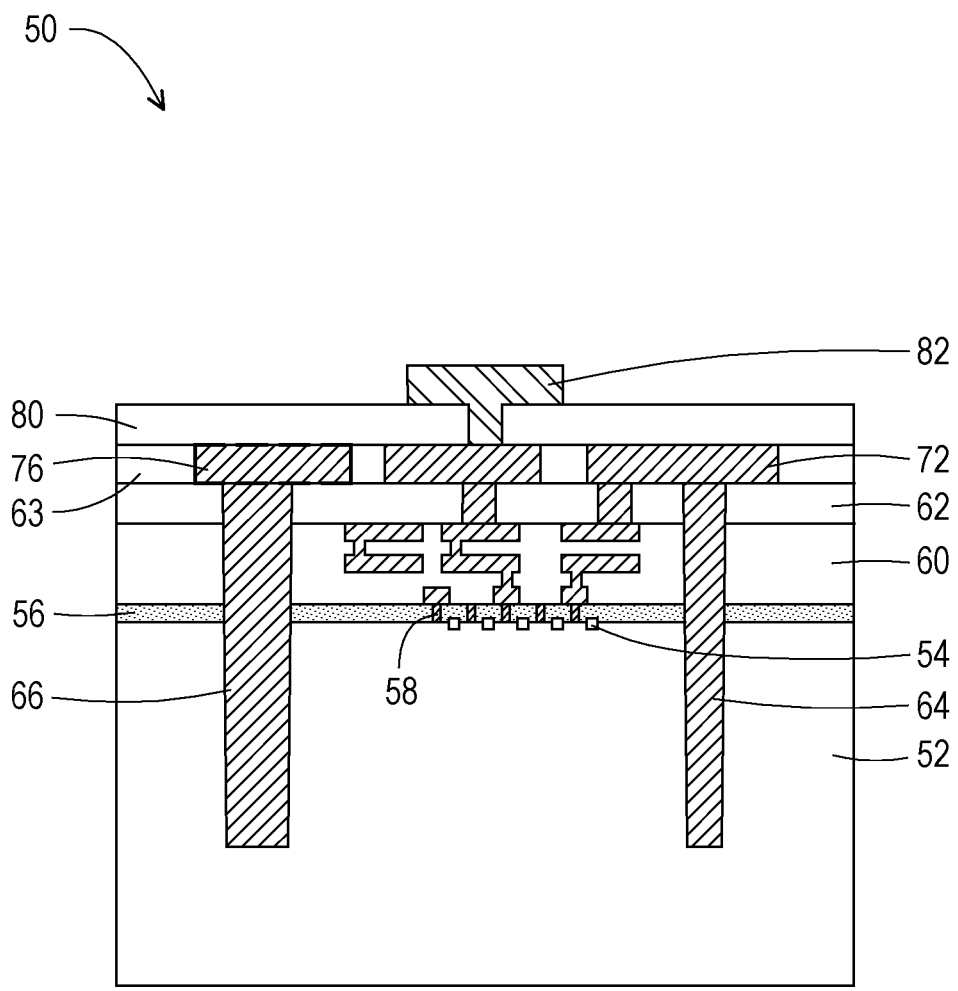

In FIG. 4, a first passivation layer 80 is formed over the dielectric layer 63, conductive lines 72, conductive vias 74, and conductive features 76, and a conductive pad 82 is formed on the first passivation layer 80, in accordance with some embodiments. In some embodiments, the first passivation layer 80 is formed of a polymer, which may be a photo-sensitive material such as PBO, polyimide, BCB, or the like, that may be patterned using a lithography mask. In some embodiments, the first passivation layer 80 is formed of silicon nitride, silicon oxynitride, silicon carbon nitride, a polymer, other materials, or combinations thereof. The first passivation layer 80 may protect underlying features from the adverse effects of detrimental chemicals and moistures in subsequent processes. The first passivation layer 80 may be formed by chemical vapor deposition (CVD), plasma-enhanced CVD (PECVD), spin-coating, lamination, other suitable processes, or a combination thereof.

A conductive pad 82 is formed over the first passivation layer 80. The conductive pad 82 may be formed of aluminum or its alloys, such as aluminum-copper alloys. In some embodiments, the conductive pad 82 includes a conductive via portion through the first passivation layer 80 for electrically coupling to the conductive lines 72.

As an example of forming the conductive pad 82, the first passivation layer 80 is patterned by an acceptable process, such as by exposing the first passivation layer 80 to light when the first passivation layer 80 is a photo-sensitive material or by etching using, for example, an anisotropic etch. If the first passivation layer 80 is a photo-sensitive material, the first passivation layer 80 can be developed after the exposure. The conductive pad 82 is then formed. The conductive pad 82 has a pad portion on and extending along the major surface of the first passivation layer 80 and a via portion (also referred to as conductive vias) extending through the first passivation layer 80 to physically and electrically couple underlying conductive features (e.g., the conductive lines 72). A seed layer is formed over the first passivation layer 80 and in the opening extending through the first passivation layer 80. In some embodiments, the seed layer is a metal layer, which may be a single layer or a composite layer comprising a plurality of sub-layers formed of different materials. In some embodiments, the seed layer comprises a titanium layer and a copper layer over the titanium layer. However, any suitable materials may be used. The seed layer may be formed using, for example, physical vapor deposition (PVD) or the like. A photoresist is then formed and patterned on the seed layer. The photoresist may be formed by spin coating or the like and may be exposed to light for patterning. The pattern of the photoresist corresponds to the conductive pad 82. The patterning forms an opening through the photoresist to expose the seed layer. A conductive material is then formed in the openings of the photoresist and on the exposed portions of the seed layer. The conductive material may be formed by plating, such as electroplating or electroless plating, or the like. The conductive material may comprise a metal, like aluminum, copper, titanium, tungsten, or the like. The combination of the conductive material and underlying portions of the seed layer form the conductive pad 82. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching.

Figure 5:
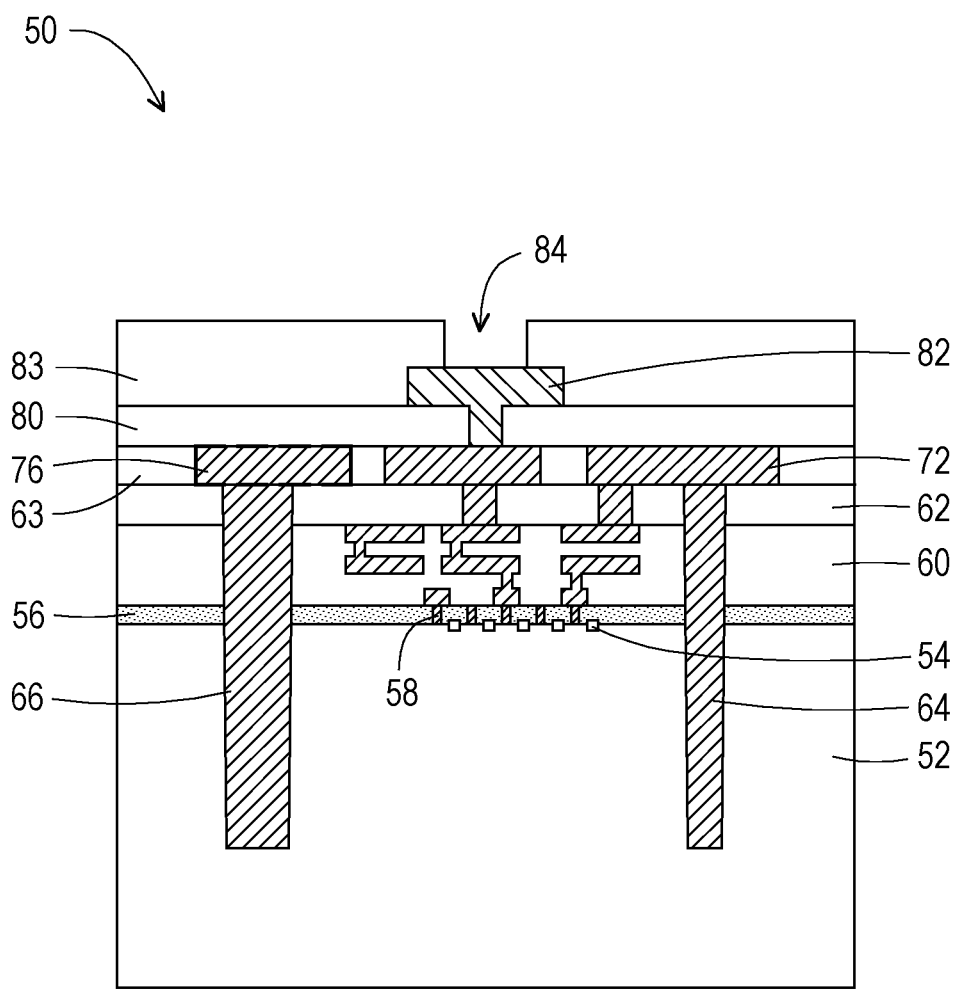

Next, in FIG. 5, a second passivation layer 83 is formed over the first passivation layer 80 and the conductive pad 82, and an opening 84 is formed in the second passivation layer 83 to expose a portion of the conductive pad 82, in accordance with some embodiments. The second passivation layer 83 may be formed using similar materials and methods as described above for the first passivation layer 80 with respect to FIG. 4. The opening 84 may be formed with an acceptable patterning process, such as by exposing the second passivation layer 83 to light when the second passivation layer 83 is a photo-sensitive material or by etching using, for example, an anisotropic etch.

Optionally, a solder region (e.g., a solder ball or a solder bump) may be disposed on the conductive pad 82 through the opening 84. The solder ball may be used to perform chip probe (CP) testing on the integrated circuit structure 50. CP testing may be performed on the integrated circuit structure 50 to ascertain whether the integrated circuit structure 50 or a portion thereof is a known good die (KGD) or known good larger structure. Thus, only integrated circuit structures 50, which are KGDs or known good larger structures, undergo subsequent processing and are packaged, and dies or structures, which fail the CP testing, are not packaged. After testing, the solder regions may be removed in subsequent processing steps.

Figure 6:
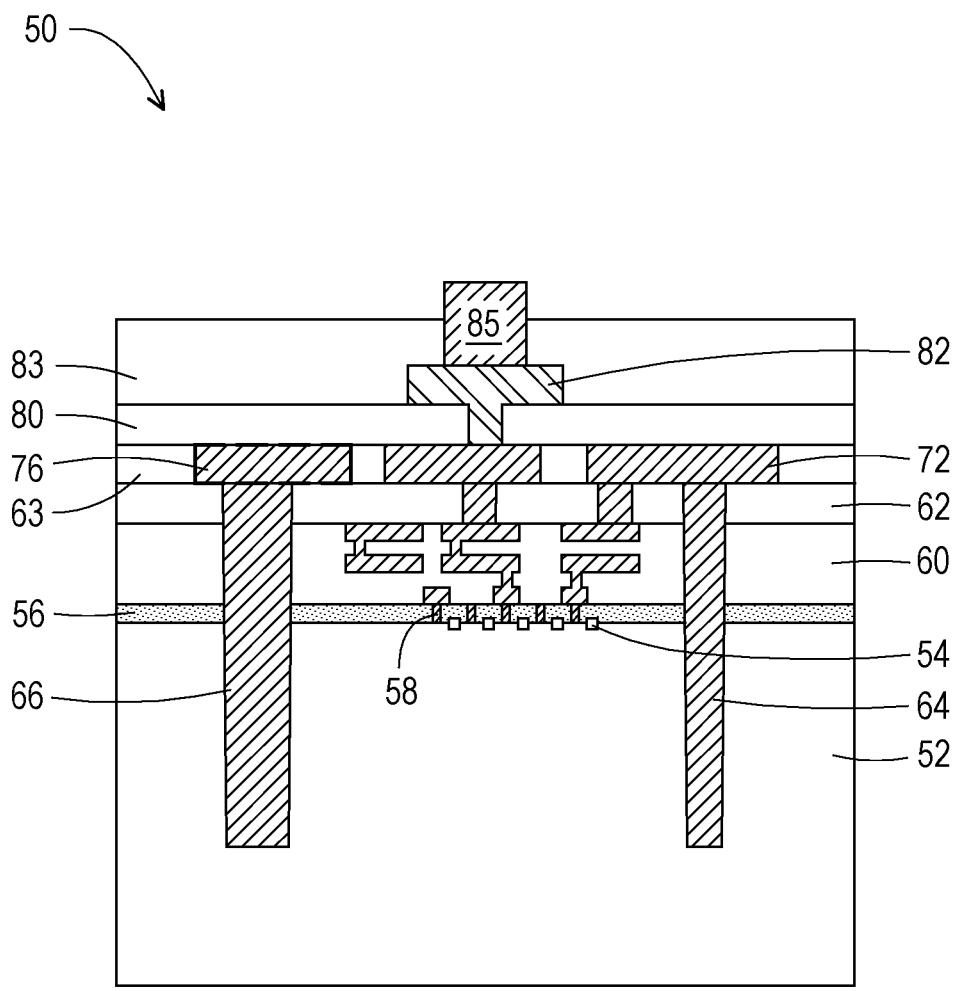

In FIG. 6, a die connector 85, such as a conductive pillar (for example, formed of a metal such as copper), extends through the opening 84 in the second passivation layer 83 and is physically and electrically coupled to the conductive pad 82. The die connector 85 may be formed by, for example, plating, or the like. The die connector 85 electrically couples the respective integrated circuits of the integrated circuit structure 50.

Figure 7:
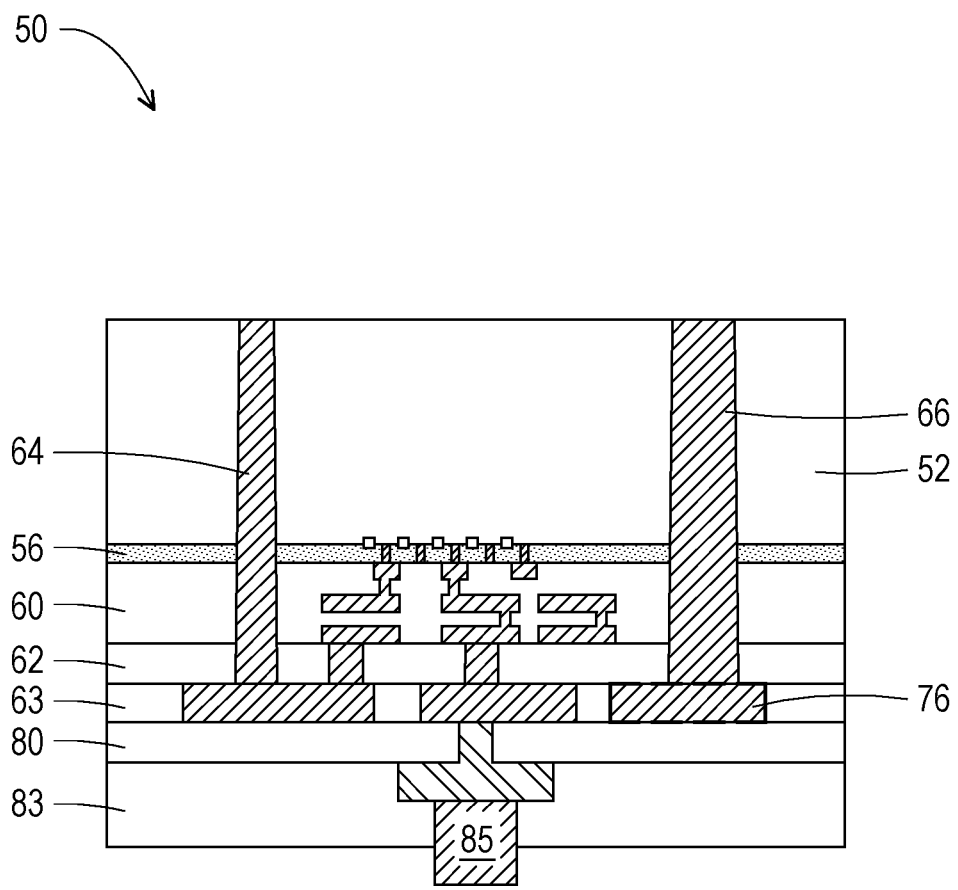

In FIG. 7, the integrated circuit structure 50 is flipped over and placed on a tape (not shown). In some embodiments, a planarization of the back side of the semiconductor substrate 52 is performed to expose the TVs 64 and the thermal fins 66. The planarization process may be, for example, a grinding and/or a chemical-mechanical polish (CMP) to remove a portion of the semiconductor substrate 52 over the surfaces of the TVs 64 and the thermal fins 66. However, any suitable process may be used.

Figure 8:
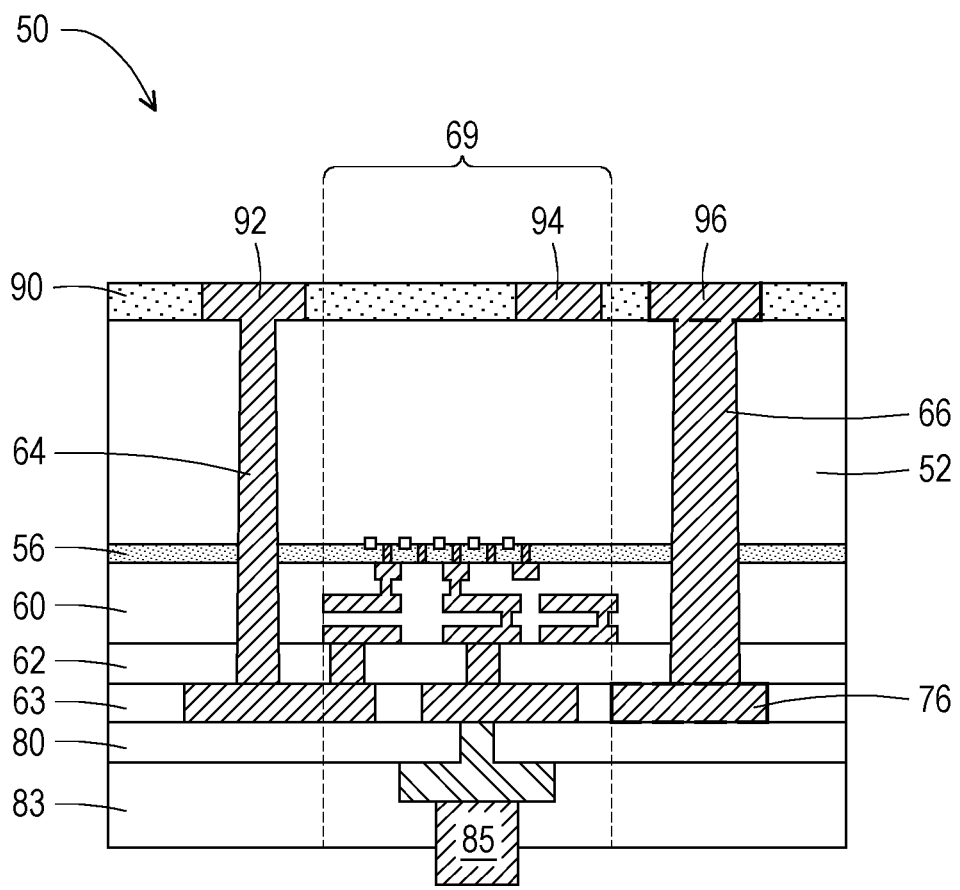

In FIG. 8, a bonding layer 90 is formed over the back side of the semiconductor substrate 52, one or more bonding pad(s) 92 are formed on exposed surfaces of the thermal fins 66, one or more bonding pad(s) 94 are formed on the semiconductor substrate 52 in the core region 69 of the integrated circuit structure 50, and one or more bonding pad(s) 96 are formed on exposed surfaces of the TVs 64. The bonding layer 90 and bonding pads 92, 94, 96 are used for subsequent bonding of integrated circuit dies and/or thermal pillars (see below, FIG. 10) to the back side of the semiconductor substrate 52. The bonding pads 92 are used for electrical coupling of the TVs 64 to the subsequently attached integrated circuit dies. The bonding pads 94 (also referred to as thermal vias) are used for thermal and physical coupling of the subsequently attached thermal pillars to the semiconductor substrate 52 in the core region 69, where thermal fins 66 may not be present. The bonding pads 96 (also referred to as conductive features or metal cappings) are used for thermal coupling of the subsequently attached thermal pillars to the thermal fins 66. In some embodiments, the bonding pads 94 formed above the thermal fins 66 have similar dimensions and arrangements as the conductive features 76 (see above, FIGS. 3A-3E) below the thermal fins 66. However, the bonding pads 94 may have any suitable dimensions or arrangements. In some embodiments, the bonding pads 94 are present and the conductive features 76 are omitted.

In some embodiments, the bonding pads 92, 94, 96 are formed before the bonding layer 90 with a seed layer and plating process. A seed layer is formed over the interposer 102. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, physical vapor deposition (PVD) or the like. A photoresist is then formed and patterned on the seed layer. Wafer scale patterning of the photoresist may be performed with image shift exposure or multi-mask exposure in a single layer. The photoresist may be formed by spin coating or the like and may be exposed to light for patterning. The pattern of the photoresist corresponds to the bonding pads 92, 94, 96. The patterning forms openings through the photoresist to expose the seed layer. A conductive material is then formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. The combination of the conductive material and underlying portions of the seed layer form the bonding pads 92, 94, 96. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching.

Next, the bonding layer 90 is formed over the back side of the semiconductor substrate 52 and the bonding pads 92, 94, 96. The bonding layer 90 may be a dielectric material such as an oxide, e.g. silicon oxide, or the like. The bonding layer 90 may be formed, for example, by spin coating, lamination, chemical vapor deposition (CVD), or the like. However, any suitable method or materials may be used. A planarization process is performed on the bonding layer 90 to expose the bonding pads 92, 94, 96. Top surfaces of the bonding layer 90 and the 92, 94, 96 may be substantially coplanar after the planarization process within process variations. The planarization process may be, for example, a chemical-mechanical polish (CMP), a grinding process, or the like.

In some embodiments, the bonding layer 90 is formed before the bonding pads 92, 94, 96. The bonding layer 90 may be formed using similar materials and methods as described above. The bonding pads 92, 94, 96 are formed with a damascene or dual damascene process in which the bonding layer 90 is patterned and etched utilizing photolithography techniques to form trenches corresponding to the desired pattern of conductive pads. An optional diffusion barrier and/or optional adhesion layer may be deposited and the trenches may be filled with a conductive material. Suitable materials for the barrier layer includes titanium, titanium nitride, titanium oxide, tantalum, tantalum nitride, titanium oxide, or other alternatives, and suitable materials for the conductive material include copper, silver, gold, tungsten, aluminum, combinations thereof, or the like. In an embodiment, the bonding pads 92, 94, 96 may be formed by depositing a seed layer of copper or a copper alloy, and filling the trenches by electroplating. A chemical mechanical planarization (CMP) process or the like may be used to remove excess conductive material from a surface of the bonding layer 90 and to planarize the surface for subsequent processing. In some embodiments, a single damascene process is used to form the bonding pads 92, 94, 96. In some embodiments, a dual damascene process is used to form one or more of the bonding pads 92, 94, 96, and the one or more of the bonding pads 92, 94, 96 comprise respective pad portions over respective via portions (see below, FIG. 14).

Figure 9:
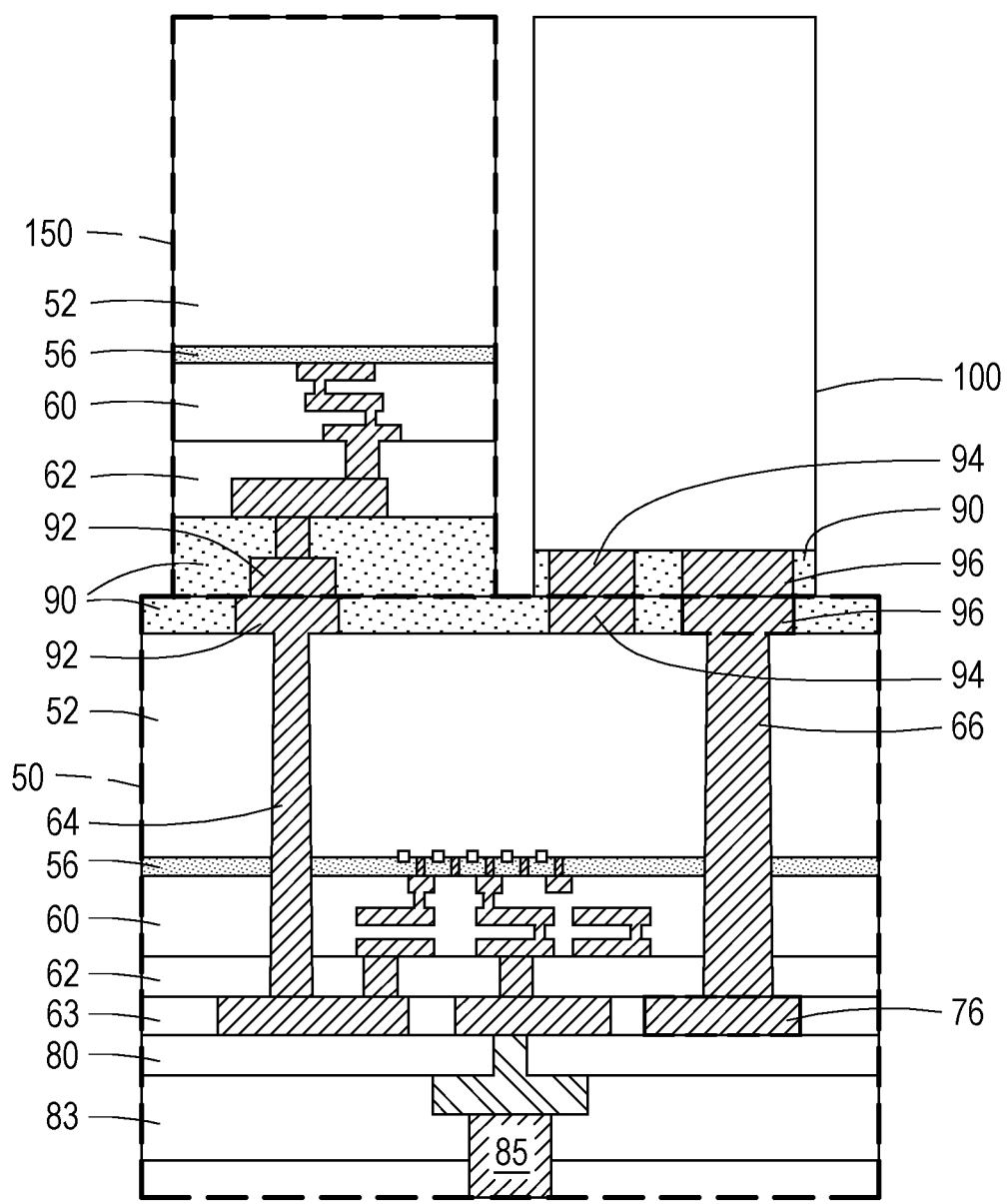

In FIG. 9, an integrated circuit die 150 and a thermal pillar 100 are attached to the back side of the integrated circuit structure 50 using suitable bonding methods. The thermal pillar 100 may be a suitable structure for transporting heat away from the integrated circuit structure 50 such as a metal (e.g., copper) pillar or a silicon pillar. In some embodiments, the thermal pillar 100 not electrically coupled to active devices or circuitry (e.g., the thermal pillar is an inactive or dummy component). The thermal pillar 100 is thermally coupled to the thermal fins 66 through one or more bonding pad(s) 96 and may conduct heat out of the integrated circuit structure 50 through the thermal fins 66, thereby improving heat dissipation efficiency of the integrated circuit structure 50. The thermal pillar 100 may be further thermally and physically coupled to the semiconductor substrate 52 by one or more bonding pad(s) 94, which contact the semiconductor substrate 52 and act as thermal conduit(s) between the semiconductor substrate 52 and the thermal pillar 100. Although one integrated circuit die 150 and one thermal pillar 100 are illustrated, any suitable number of integrated circuit dies 150 and thermal pillars 100 may be attached to the back side of the integrated circuit structure 50.

The integrated circuit die 150 may be formed using similar methods and materials as the integrated circuit structure 50 as described above with respect to FIGS. 1-3A and 8. For example, in some embodiments the integrated circuit die 150 has a respective semiconductor substrate 52, a respective ILD layer 56 over the respective semiconductor substrate 52, a respective interconnect structure 60 over the respective ILD layer 56, respective conductive lines 72 and conductive vias 74 in a respective dielectric layer 62 over the respective interconnect structure 60, and one or more respective bonding pad(s) 92 in a respective bonding layer 90 over the respective dielectric layer 62. In the illustrated example of FIG. 9, the one or more respective bonding pad(s) 92 has a pad portion over a via portion and may be formed with a dual damascene process. However, any suitable integrated circuit die 150 may be attached to the integrated circuit structure 50. As an example, in some embodiments, the integrated circuit die 150 includes thermal fins 66, one or more TV(s) 64, or one or more conductive pad(s) 82 in a first passivation layer 80 and a second passivation layer 83 as described above with respect to FIGS. 3A-5. As another example, the bonding layer 90 of the integrated circuit die 150 may be a second passivation layer 83 and the one or more bonding pad(s) 92 of the integrated circuit die 150 may be conductive pads 82.

In some embodiments, the integrated circuit die 150 is attached to the integrated circuit structure 50 with metal-metal bonds, e.g. Cu—Cu or Al—Al bonds, between respective bonding pads 92, and oxide-oxide bonds between respective bonding layers 90. However, any suitable method (e.g., solder joints) may be used to attach the integrated circuit die 150 is attached to the integrated circuit structure 50.

As an example of bonding between the integrated circuit die 150 and the integrated circuit structure 50, the bonding process starts with aligning and bonding the integrated circuit die 150 and the integrated circuit structure 50. Bonding may include applying a surface treatment to one or more of the respective bonding layers 90. The surface treatment may include a plasma treatment. The plasma treatment may be performed in a vacuum environment. After the plasma treatment, the surface treatment may further include a cleaning process (e.g., a rinse with deionized water, or the like) that may be applied to one or more of the respective bonding layers 90. The bonding process may then proceed to aligning one or more respective bonding pad(s) 92. When the integrated circuit die 150 and the integrated circuit structure 50 are aligned, the one or more respective bonding pad(s) 92 of the integrated circuit die 150 may overlap with the corresponding one or more respective bonding pad(s) 92 of the integrated circuit structure 50. Next, the bonding includes a pre-bonding step, during which the integrated circuit die 15 is put in contact with the integrated circuit structure 50. The pre-bonding may be performed at room temperature (e.g., in a range of 21° C. and 25° C.). The bonding process continues with performing an anneal, for example, at a temperature in a range of 150° C. to 400° C. for a duration in a range of 0.5 hours to 3 hours, so that the metal in the one or more respective bonding pad(s) 92 of the integrated circuit die 150 (e.g., copper or aluminum) and the metal of the one or more respective bonding pad(s) 92 of the integrated circuit structure 50 (e.g., copper or aluminum) inter-diffuses to each other, and hence the direct metal-to-metal bonding is formed.

The thermal pillar 100 may be attached to the integrated circuit structure 50 with similar methods as described for the integrated circuit die 150. For example, the thermal pillar 100 may have a respective bonding layer 90 on a bottom surface with respective bonding pads 94, 96 through the bonding layer 90. The respective bonding layer 90 and the respective bonding pads 94, 96 may be formed with similar methods and materials as the bonding layer 90 and bonding pads 94, 96 as described above with respect to FIG. 8. The respective bonding layer 90 and respective bonding pads 94, 96 of the thermal pillar are then hybrid bonded with the respective bonding layer 90 and respective bonding pads 94, 96 of the integrated circuit structure 50. However, any suitable bonding method may be used to attach the thermal pillar 100 to the integrated circuit structure 50.

Figure 10A:
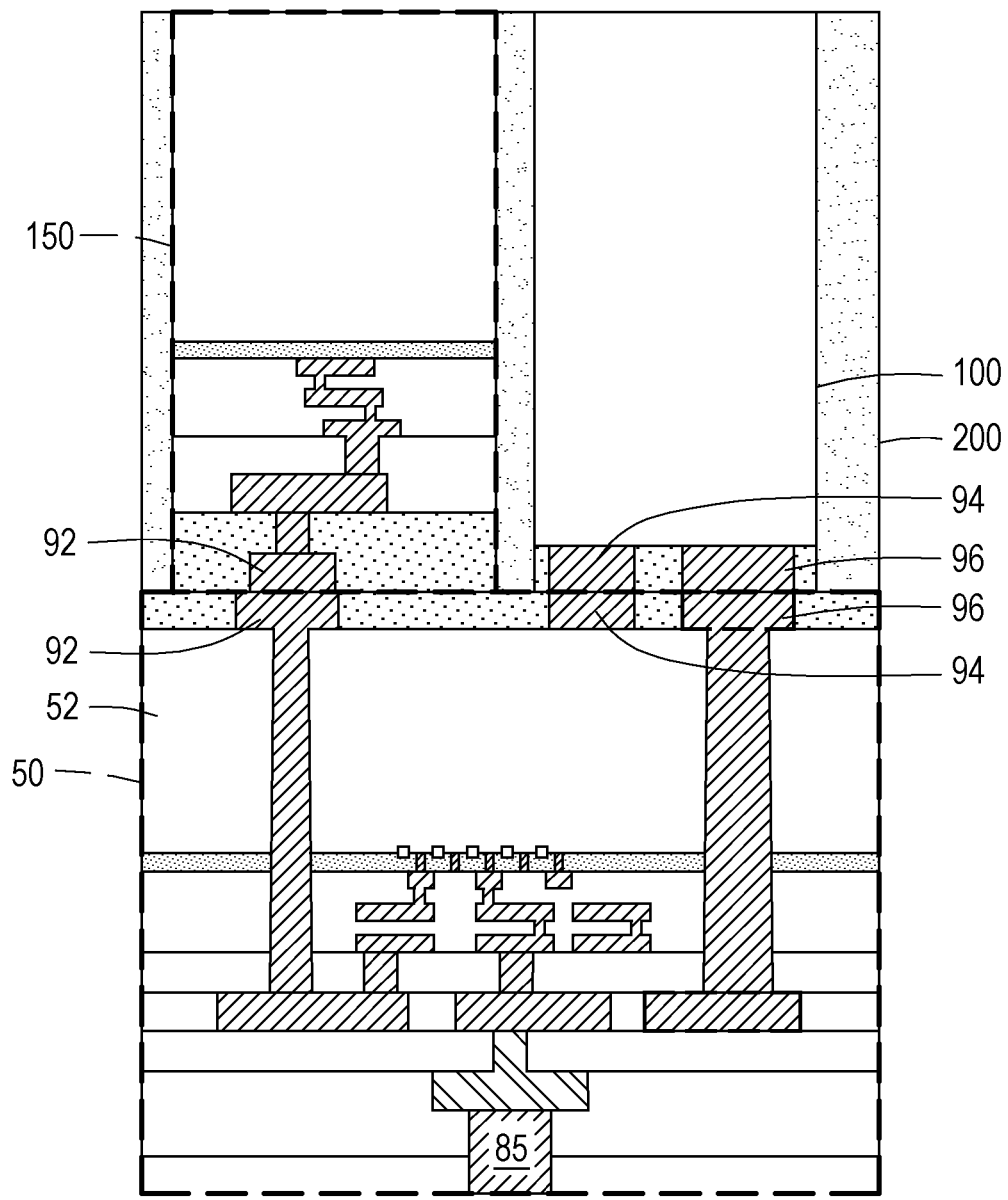
Figure 10B:
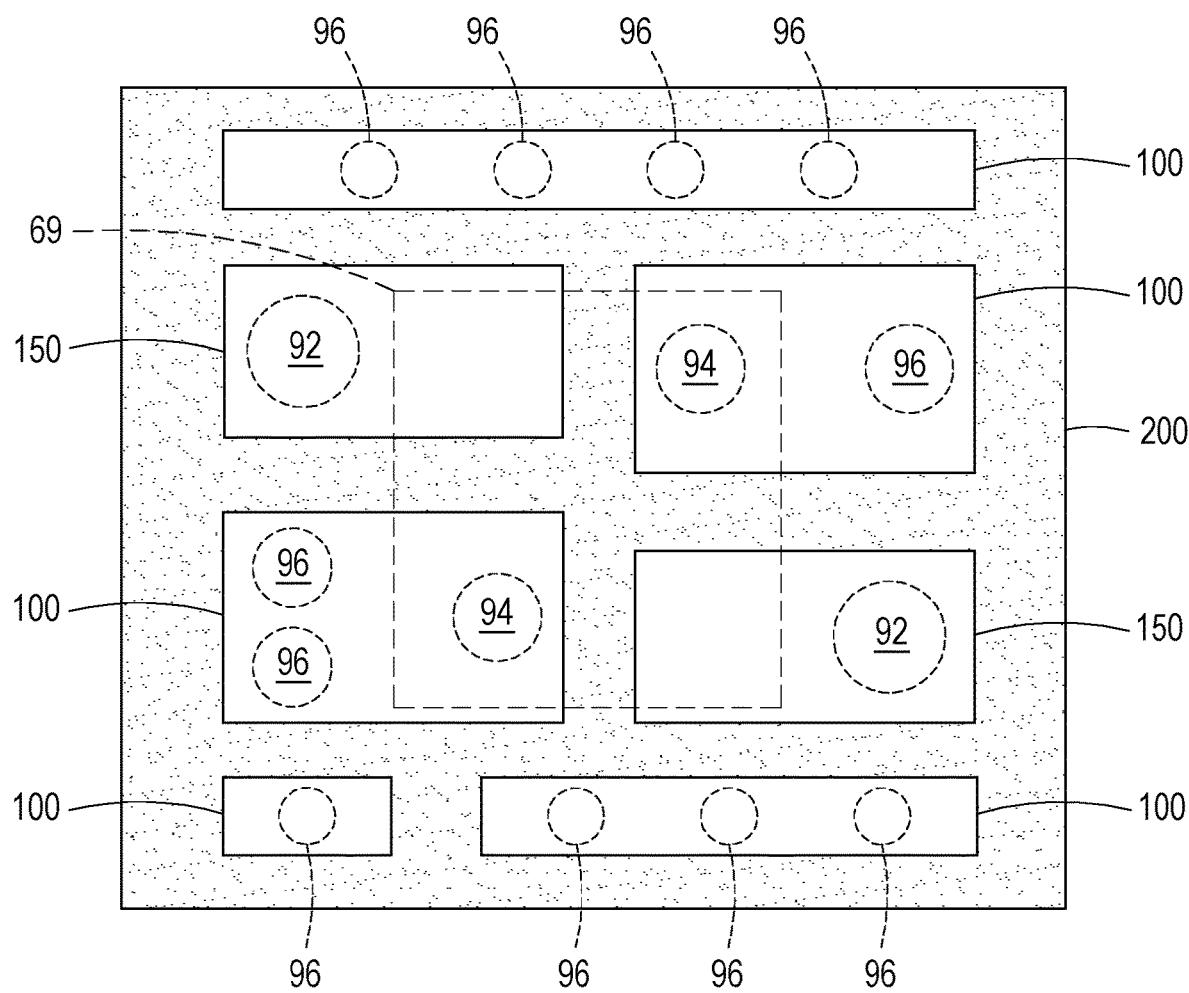

In FIGS. 10A and 10B, an encapsulant 200 is formed on the integrated circuit structure 50 and around the one or more thermal pillar(s) 100 and the one or more integrated circuit die(s) 150. In some embodiments, the encapsulant 200 is a molding compound that comprises an epoxy, an organic polymer, a polymer with or without a silica-based filler or glass filler added, or other materials. In some embodiments, the encapsulant 200 comprises a liquid molding compound (LMC) that is a gel-type liquid when applied. The encapsulant 200 may also comprise a liquid or solid when applied. In some embodiments, the encapsulant 200 may comprise other insulating and/or encapsulating materials. In some embodiments, such as embodiments in which the integrated circuit structure 50 is a wafer or wafer scale structure, the encapsulant 200 is applied using a wafer level molding process. In some embodiments in which the integrated circuit structure 50 is a die or die scale structure, the encapsulant 200 is applied in a subsequent step, such as after attaching the integrated circuit structure 50 to a package substrate. The encapsulant 200 may be molded using, for example, compressive molding, transfer molding, molded underfill (MUF), or other methods.

Next, the encapsulant 200 is cured using a curing process, in some embodiments. The curing process may comprise heating the encapsulant 200 to a predetermined temperature for a predetermined. period of time, using an anneal process or other heating process. The curing process may also comprise an ultra-violet (UV) light exposure process, an infrared (IR) energy exposure process, combinations thereof, or a combination thereof with a heating process. In some embodiments, the encapsulant 200 may be cured using other methods. In some embodiments, a curing process is not included.

After the encapsulant 200 is formed, a planarization process, such as a chemical mechanical polish (CMP), may be performed to remove excess portions of the encapsulant 200 from over one or more thermal pillar(s) 100 and the one or more integrated circuit die(s) 150, such that the encapsulant al 200, the one or more thermal pillar(s) 100, and the one or more integrated circuit die(s) 150 have a coplanar upper surface.

In some embodiments in which the integrated circuit structure 50 is a wafer or wafer scale structure, a singulation process is performed by sawing along scribe line regions, e.g., between adjacent package regions of the integrated circuit structure 50. The sawing singulates the package regions of the integrated circuit structure 50 with attached encapsulant 200 around the one or more thermal pillar(s) 100 and the one or more integrated circuit die(s) 150. In some embodiments, the singulation process is performed before the integrated circuit structure 50 is coupled to a package substrate (see below, FIG. 11). In some embodiments (not shown), the singulation process is performed after the integrated circuit structure 50 is coupled to a package substrate. As illustrated in FIG. 10A, the molding material 200 may be coterminous with the semiconductor substrate 52 due to singulation of the integrated circuit structure 50 from a larger structure, such that sidewalls of the molding material 200 are vertically aligned with respective sidewalls of the integrated circuit structure 50.

FIG. 10B illustrates an example top view of the molding material 200 around one or more thermal pillar(s) 100 and one or more integrated circuit die(s) 150, in accordance with some embodiments. The top view of FIG. 10B follows from the top view of FIG. 2G with a reversal due to the integrated circuit structure 50 being flipped over (see above, FIG. 7). In some embodiments, the one or more thermal pillar(s) 100 are disposed above and coupled with thermal arrays 68 of thermal fins 66, and the one or more integrated circuit die(s) 150 are disposed above and coupled with TVs 64. Example positions of bonding pads 92 on the undersides of the one or more integrated circuit die(s) 150 and bonding pads 94, 96 on the undersides of the one or more thermal pillar(s) 100 are shown by dashed lines. Bonding pads 94 may be over the core region 69 of the integrated circuit structure 50. Although FIG. 10B illustrates five thermal pillars 100 and two integrated circuit dies 150, any suitable numbers of thermal pillar(s) 100 and integrated circuit die(s) 150 may be present in any suitable arrangement. Additionally, the integrated circuit dies 150 may be coupled with any suitable number of respective bonding pads 92, and the thermal pillar(s) 100 may be coupled with any suitable number of respective bonding pads 94, 96 in any suitable arrangements.

Figure 11:
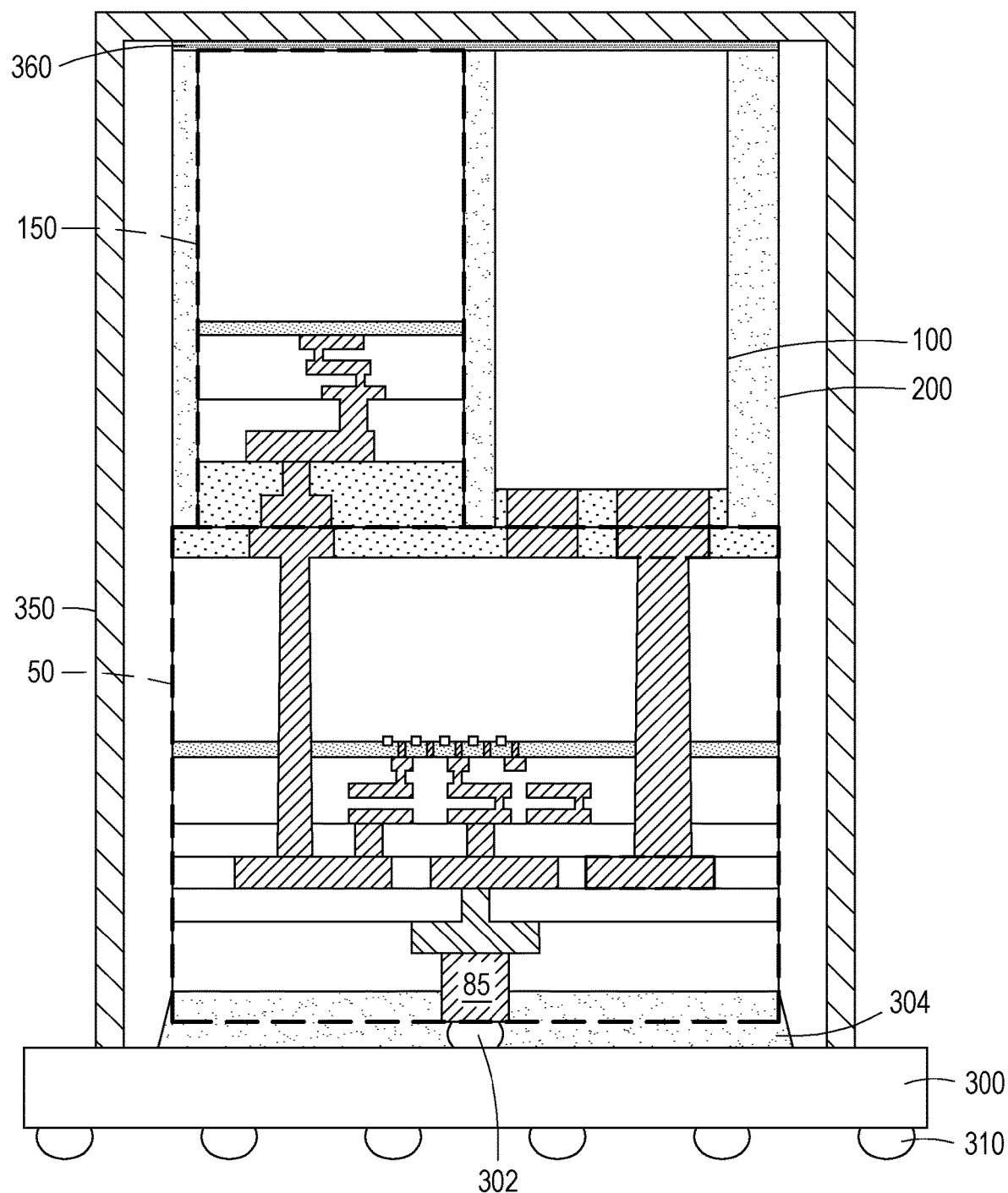

FIG. 11 follows from FIG. 10A and illustrates the integrated circuit structure 50 attached to a package substrate 300, in accordance with some embodiments. The package substrate 300 may be a printed circuit board (PCB) or an organic substrate, e.g. a core substrate. Die connectors 85 of the integrated circuit structure 50 may be coupled to conductive features of the package substrate 300 by connectors 302, such as controlled collapse chip connection (C4) bumps. Although only one die connector 85 and one connector 302 are illustrated in FIG. 11, any suitable number of die connectors 85 and connectors 302 may be present. In some embodiments in which the integrated circuit structure 50 and the package substrate 300 are wafers or wafer scale structures, a singulation process is performed after the integrated circuit structure 50 is attached to the package substrate 300.

Next, an underfill material 304 may be formed between the integrated circuit structure 50 and the package substrate 300. In some embodiments, the underfill material 133 comprises a liquid epoxy that is dispensed in a gap between integrated circuit structure 50 and the package substrate 300, e.g., using a dispensing needle or other suitable dispensing tool, and then cured to harden. As illustrated in FIG. 11, the underfill material 133 fills the gap between the integrated circuit structure 50 and the package substrate 300. External connectors 310, such as ball grid array (BGA) connectors, may be coupled to conductive features of the package substrate 300.

In some embodiments, a lid 350 (also referred to as a heat dissipation lid) is attached to the integrated circuit structure 50 and the package substrate 300. The lid 350 may conduct heat out of the one or more thermal pillar(s) 100 and the one or more integrated circuit die(s) 150 to further improve heat dissipation efficiency. A thermal interface material (TIM) 360 may be applied to the top surface of the molding material 200, the one or more thermal pillar(s) 100, and the one or more integrated circuit die(s) 150. The TIM 360 is formed of a suitable material with high thermal conductivity. In some embodiments, the TIM 360 is formed of a dielectric material that is a mixture of carbon and a polymer, where the polymer may be, e.g., a resin-based polymer or an acrylic-based polymer. The TIM 360 may also be a graphite or graphene film.

Next, the lid 350 may be attached to the upper surface of the package substrate 300 to form an enclosed space between the lid 350 and the package substrate 300. The lid 350 may be formed of a material suitable for heat dissipation, such as copper, aluminum, steel, stainless steel, or the like. The lid 350 may be formed by any suitable manufacturing process, e.g. machining, stamping, or the like. The lid 350 physically contacts the TIM 360 and conducts heat from the one or more thermal pillar(s) 100 and the one or more integrated circuit die(s) 150 through the TIM 360 in order to dissipate heat from the integrated circuit structure 50. The presence of the thermal fins 66 and their being coupled to the lid 350 through the one or more thermal pillar(s) 100 and the TIM 360 may increase the heat dissipation efficiency of the structure.

FIGS. 12-18 follow from FIG. 1 and illustrate intermediate steps in the fabrication of thermal fins 66 in the integrated circuit structure 50 and the attachment of the integrated circuit structure 50 to one or more die(s) and one or more thermal pillar(s) in a face-to-face (F2F) stacking to form a bonded semiconductor structure, in accordance with some embodiments.

Figure 12:
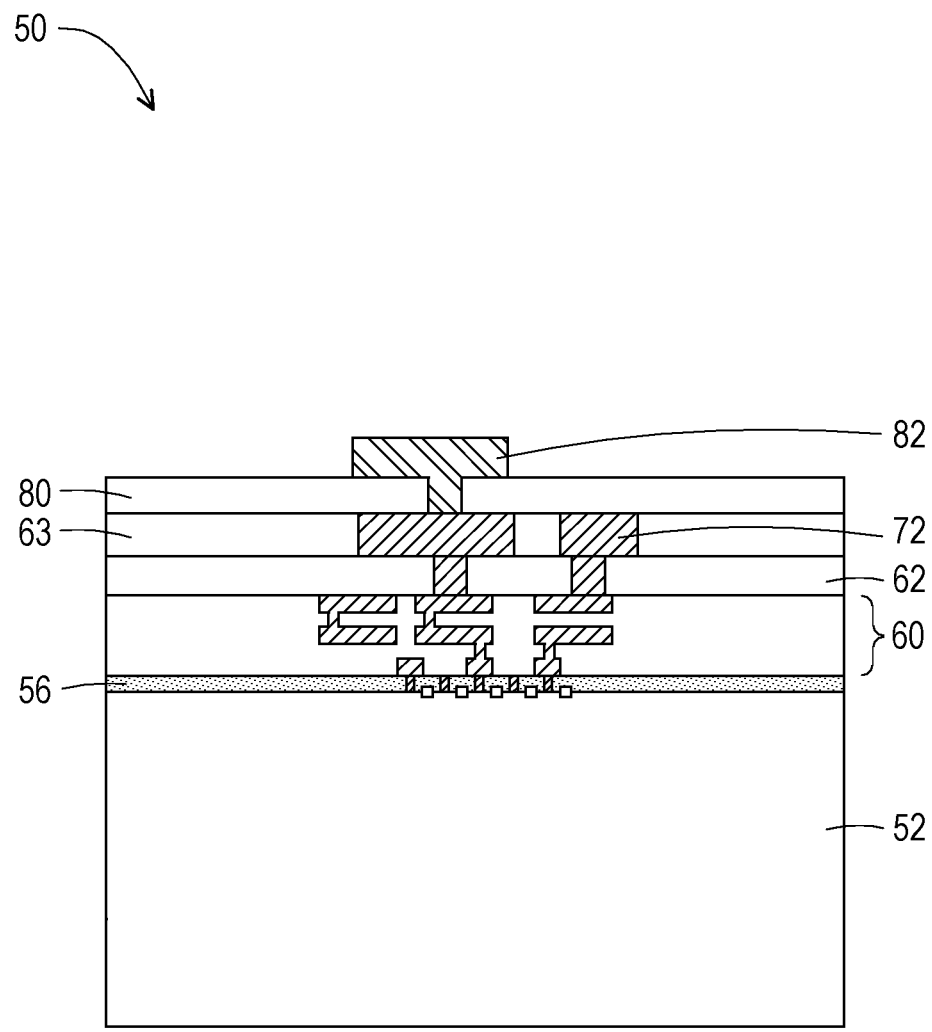
FIGS. 12 through 18 illustrate cross-sectional views of intermediate steps during a process for forming a bonded semiconductor structure, in accordance with some embodiments.

FIG. 12 illustrates another integrated circuit structure 50, in accordance with some embodiments. The integrated circuit structure 50 may be similar to the integrated circuit structure 50 described above with reference to FIGS. 1-3A where like reference numerals indicate like elements formed using like processes, but in which the first passivation layer 80 and conductive pad 82 (see above, FIG. 4) is formed before forming thermal fins or TVs.

Figure 13:
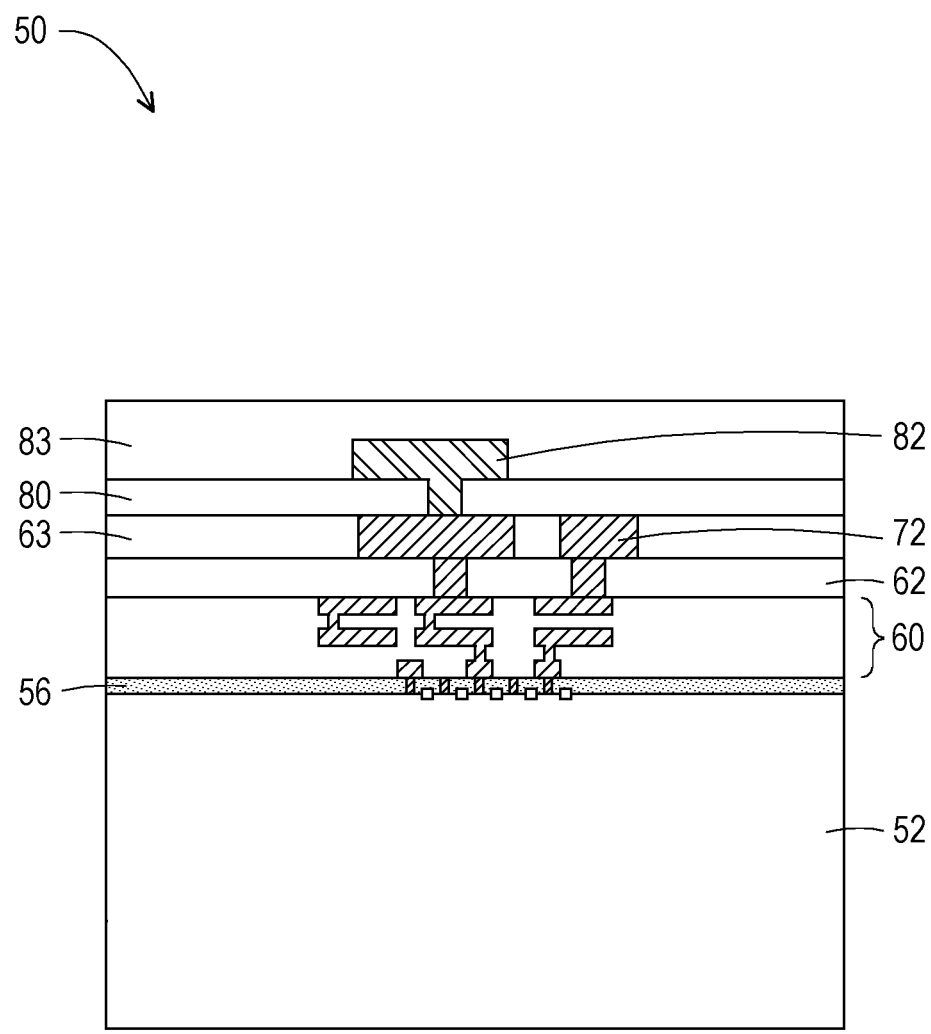

Next, in FIG. 13, a second passivation layer 83 is formed over the first passivation layer 80 and the conductive pad 82, in accordance with some embodiments. The second passivation layer 83 may be formed using similar materials and methods as described above for the first passivation layer 80 with respect to FIG. 4, and the details are not repeated herein.

Figure 14:
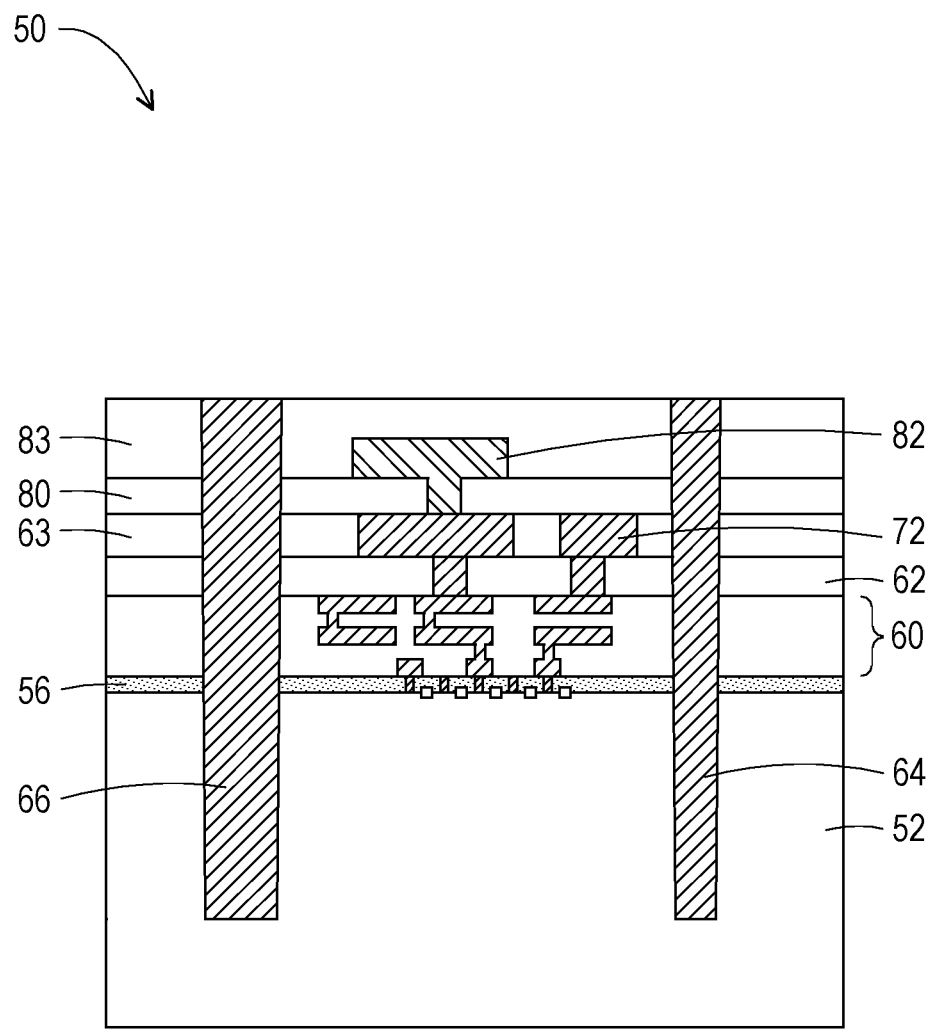

In FIG. 14, thermal fins 66 and TVs 64 are formed through the second passivation layer 83, the first passivation layer 80, the dielectric layer 63, the dielectric layer 62, the interconnect structure 60, the ILD layer(s) 56, and are formed extending into the semiconductor substrate 52. The thermal fins 66 and TVs 64 may be formed using similar methods and materials as described above with respect to FIGS. 2A-2B, and the details are not repeated herein. The thermal fins 66 may provide increased heat dissipation efficiency for the integrated circuit structure 50 and other devices or structures attached to it (see below, FIG. 15).

Figure 15:
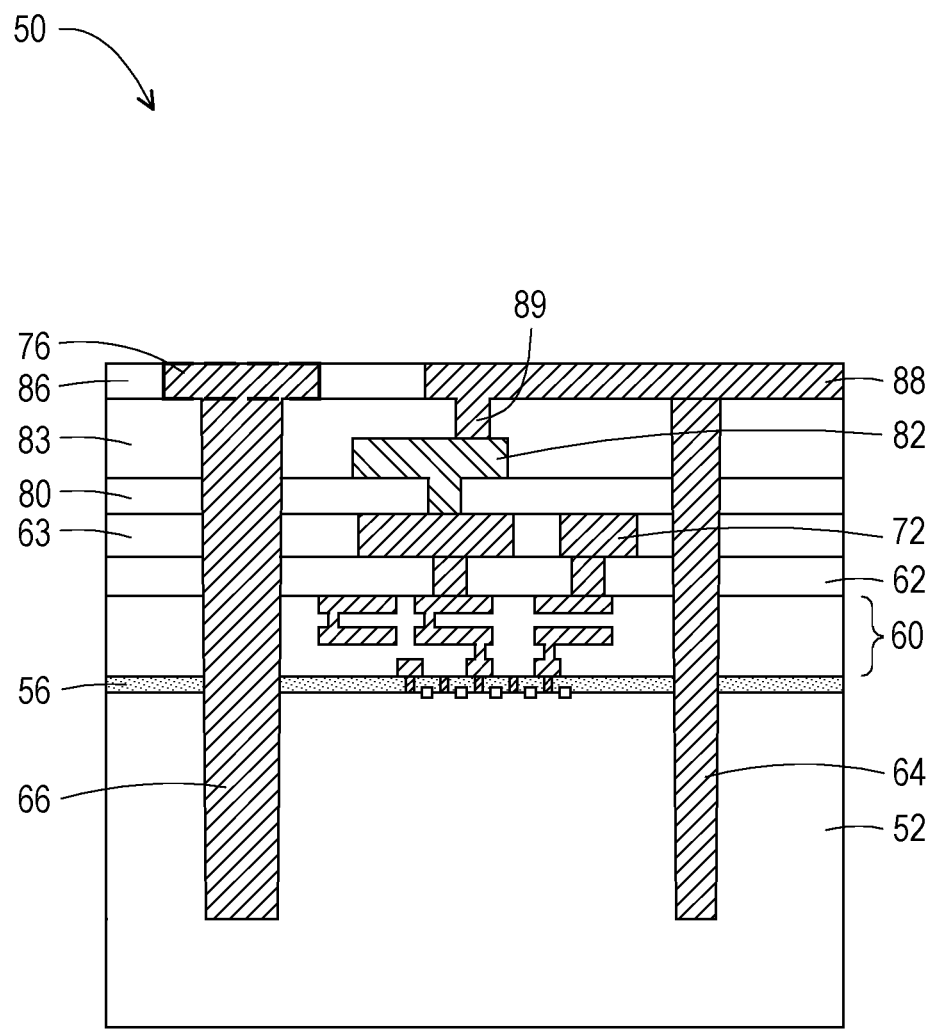

Next, in FIG. 15, a dielectric layer 86 is formed over the second passivation layer 83, the TVs 64, and the thermal fins 66, and conductive lines 88, conductive vias 89, and conductive features 76 (also referred to as metal cappings) are formed in the dielectric layer 86, in accordance with some embodiments. The dielectric layer 86 may be formed using similar methods and materials as the dielectric layer 62 as described above with respect to FIG. 1, and the details are not repeated herein.

The conductive lines 88, conductive vias 89, and conductive features 76 may provide electrical and/or thermal connection between TVs 64, conductive pads 82, and thermal fins 66 with subsequently formed or attached features. The conductive lines 88, conductive vias 89, and conductive features 76 may be formed using similar methods and materials as the conductive lines L1, conductive vias V2, and conductive lines L2 (e.g., single or dual damascene processes) as described above with respect to FIG. 1, and the details are not repeated herein.

Figure 16:
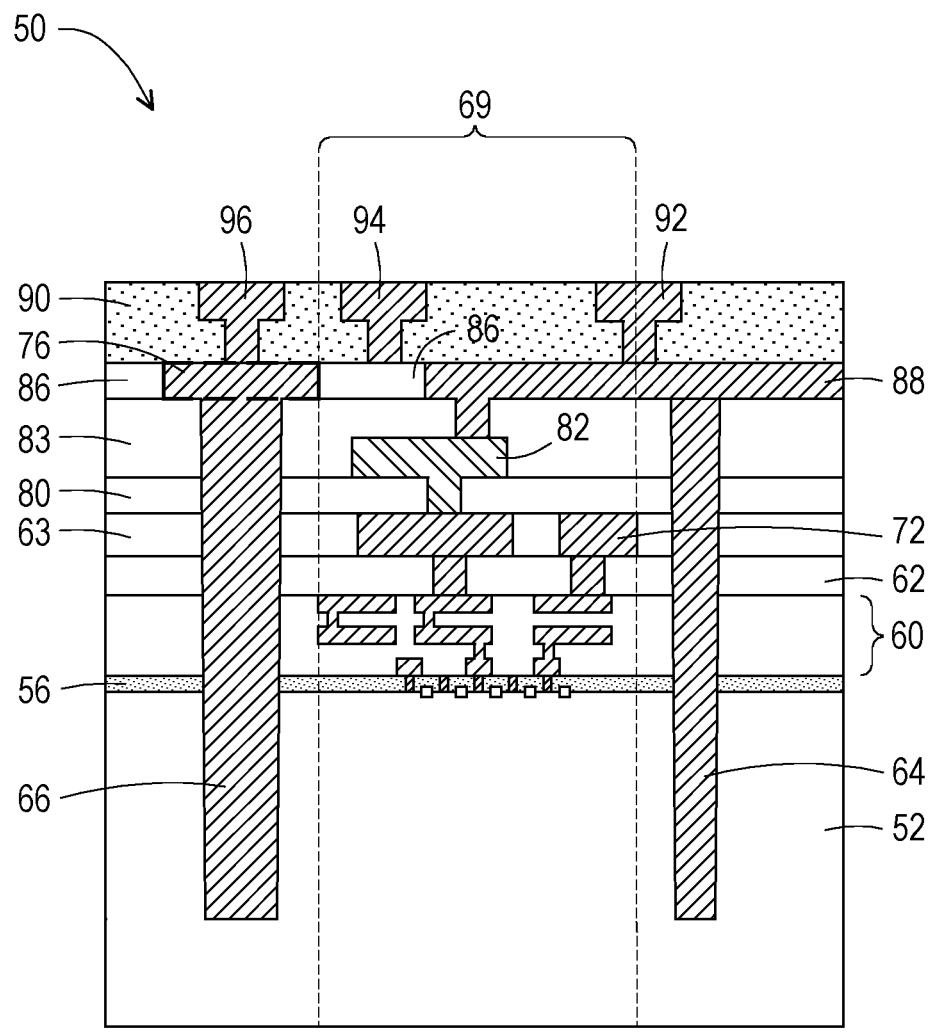

In FIG. 16, a bonding layer 90 is formed over the dielectric layer 86, one or more bonding pad(s) 92 are formed on the conductive features 76, one or more bonding pad(s) 94 are formed on the dielectric layer 86, and one or more bonding pad(s) 96 are formed on the conductive lines 88. The bonding layer 90 and bonding pads 92, 94, 96 are used for subsequent bonding of integrated circuit dies and/or thermal pillars (see below, FIG. 17) to the front side of the integrated circuit structure 50. The bonding pads 92 are used for electrical coupling of the TVs 64 and/or conductive pads 82 to the subsequently attached integrated circuit dies. The bonding pads 94 (also referred to as thermal vias) are used over the core region 69 for thermal coupling of the subsequently attached thermal pillars. The bonding pads 96 (also referred to as conductive features or metal cappings) are used for thermal coupling of the subsequently attached thermal pillars to the thermal fins 66. The bonding layer 90 and the one or more bonding pad(s) 92, 94, 96 may be formed using similar methods and materials as described above with respect to FIG. 8 and the details are not repeated herein.

In the illustrated embodiment of FIG. 16, a dual damascene process is used to form the one or more bonding pad(s) 92, 94, 96, and the one or more of the bonding pads 92, 94, 96 comprise respective pad portions over respective via portions. The respective pad portions of the one or more of the bonding pads 92, 94, 96 have larger widths than the respective via portions of the one or more of the bonding pads 92, 94, 96. The respective pad portions of the one or more bonding pad(s) 92, 94, 96 extend to top surfaces of the bonding layer 90, and the respective via portions of the one or more bonding pads 92, 94, 96 extend to bottom surfaces of the bonding layer 90. However, any suitable bonding pad(s) 92, 94, 96 may be formed in the bonding layer 90, or the bonding layer 90 may be formed around any suitable bonding pad(s) 92, 94, 96.

Figure 17:
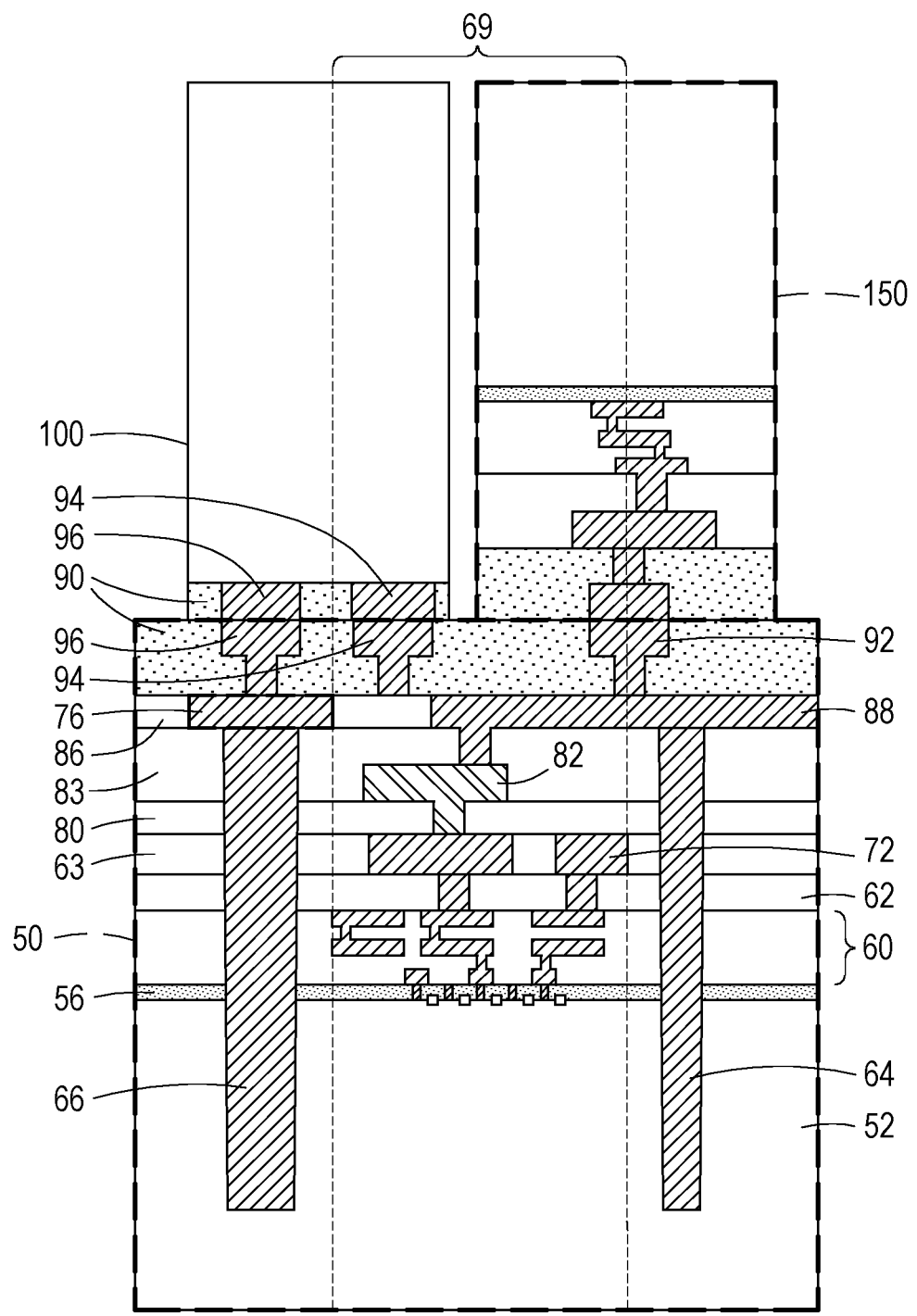

Next, in FIG. 17, an integrated circuit die 150 and a thermal pillar 100 are attached to the front side of the integrated circuit structure 50 using suitable bonding methods. The integrated circuit die 150, the thermal pillar 100, and the methods for attaching the integrated circuit die 150 and the thermal pillar 100 to the integrated circuit structure 50 may be similar as described above with respect to FIG. 9, and the details are not repeated herein.

Figure 18:
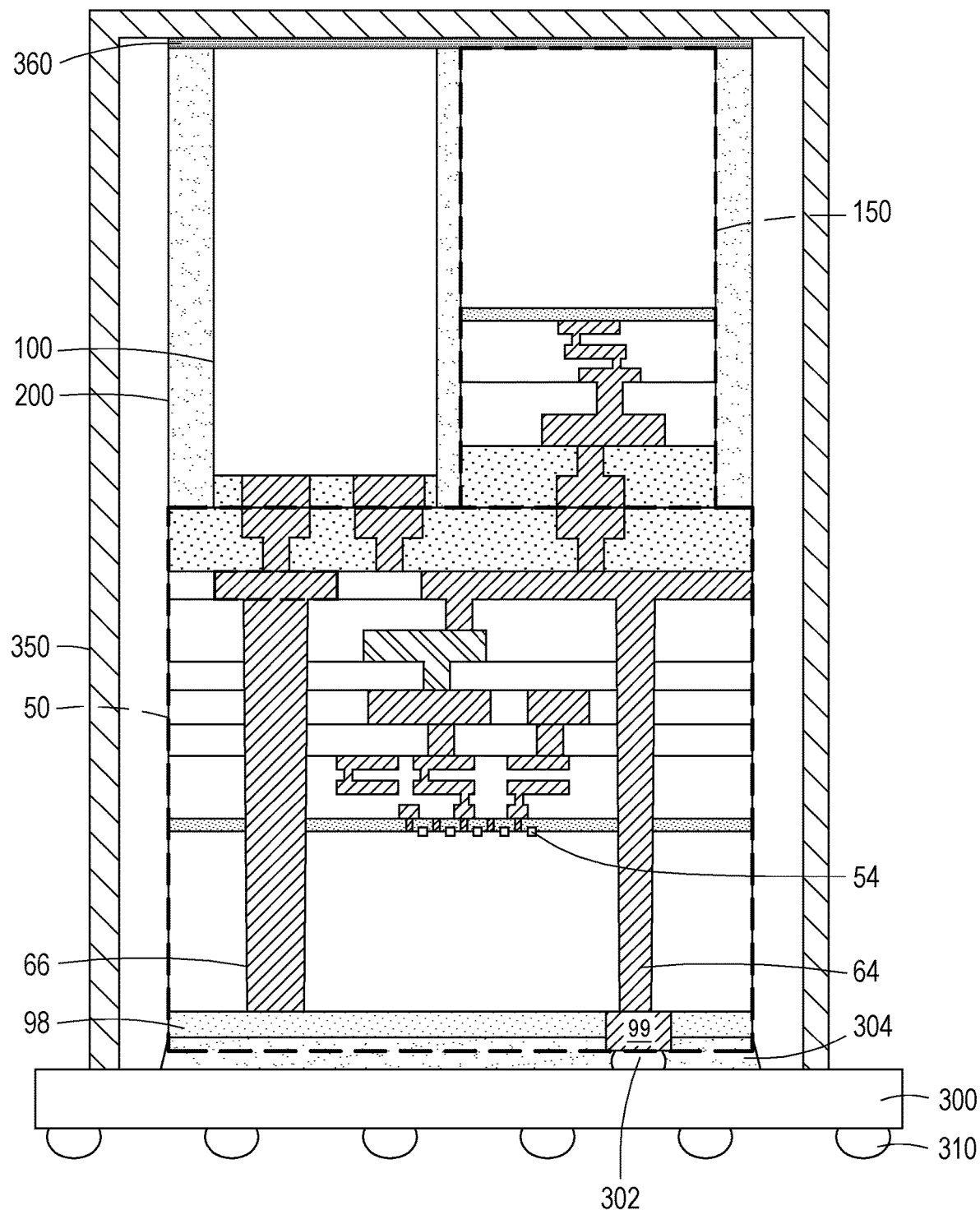

In FIG. 18, an encapsulant 200 is formed on the integrated circuit structure 50 and around the one or more thermal pillar(s) 100 and the one or more integrated circuit die(s) 150, and the bonded structure is then attached to a package substrate 300. The encapsulant 200 may be formed using similar methods and materials as described above with respect to FIG. 10A and the details are not repeated herein.

Subsequently, the integrated circuit structure 50 is flipped over and placed on a tape (not shown). A planarization of the back side of the semiconductor substrate 52 is performed to expose the TVs 64 and the thermal fins 66. The planarization process may be performed using similar methods as described above with respect to FIG. 7, and the details are not repeated herein.

Next, a dielectric layer 98 is formed over the back side of the semiconductor substrate 52 and the exposed surfaces of the TVs 64 and the thermal fins 66. The dielectric layer 98 may be formed with similar methods and materials as the dielectric layer 62 as described above with respect to FIG. 1, and the details are not repeated herein. Under ball metallizations (UBMs) 99 are then formed for external connection to the TVs 64. Although one UBM 99 is illustrated in FIG. 18, any suitable number of UBMs may be formed to couple to the TVs 64. The UBMs 99 extend through the dielectric layer 98 to physically and electrically couple the TVs 64. As a result, the UBMs 99 are electrically coupled through the TVs 64 to the active devices 54 and/or the integrated circuit dies 150. The UBMs 99 may be formed using similar materials and methods as the conductive lines L1, conductive vias V2, and conductive lines L2 (e.g., single or dual damascene processes) as described above with respect to FIG. 1, and the details are not repeated herein. In some embodiments, the UBMs 99 have a different size than the conductive lines L1, conductive vias V2, and conductive lines L2. In some embodiments in which the integrated circuit structure 50 is a wafer or wafer scale structure, a singulation process is performed before attaching the integrated circuit structure 50 to a package substrate 300.

The integrated circuit structure 50 is then flipped over again and attached to a package substrate 300, which may be similar to the package substrate 300 described above with respect to FIG. 11. The UBMs 99 of the integrated circuit structure 50 may be coupled to conductive features of the package substrate 300 by connectors 302, such as controlled collapse chip connection (C4) bumps. In some embodiments in which the integrated circuit structure 50 is a wafer or wafer scale structure, a singulation process is performed after forming the UBMs 99 and before attaching the integrated circuit structure 50 to the package substrate 300. In some embodiments, the singulation process is performed after the integrated circuit structure 50 is attached to the package substrate 300. In some embodiments, a TIM 360 is applied to the top surface of the molding material 200 and the one or more thermal pillar(s) 100 and one or more integrated circuit die(s) 150, and a lid 350 is attached to the package substrate 300 and the TIM 360 as described above with respect to FIG. 11.

Embodiments may achieve advantages. Thermal fins are formed in integrated circuit structures (e.g., dies, wafers, or the like) to improve heat dissipation. The thermal fins may be formed with the same processes and have similar structures as through vias (TVs). The thermal fins are compatible with other heat dissipation solutions such as thermal pillars and provide increased heat dissipation efficiency. For example, the thermal fins may conduct heat out of the integrated circuit structures and into thermal pillars (e.g., metal or silicon pillars) with greater efficiency than thermal pillars alone or conventional TVs.

In accordance with an embodiment, a semiconductor device includes: an integrated circuit structure, including: a semiconductor substrate including circuitry; a dielectric layer over the semiconductor substrate; an interconnect structure over the dielectric layer; and a first thermal fin extending through the semiconductor substrate, the dielectric layer, and the interconnect structure, the first thermal fin being electrically isolated from the circuitry; and a thermal pillar over the integrated circuit structure, wherein the thermal pillar is thermally coupled to the first thermal fin. In an embodiment, the thermal pillar is coupled to the first thermal fin through a conductive feature on a back side of the semiconductor substrate, wherein the back side is opposite the dielectric layer. In an embodiment, the semiconductor device further includes a passivation layer over the interconnect structure, wherein the thermal pillar is coupled to the first thermal fin through a conductive feature over the passivation layer. In an embodiment, the semiconductor device further includes a second thermal fin extending through the semiconductor substrate, the dielectric layer, and the interconnect structure, a longitudinal axis of the first thermal fin being parallel to a longitudinal axis of the second thermal fin. In an embodiment, the first thermal fin includes a first thermal strip, a second thermal strip, and a connecting portion between the first thermal strip and the second thermal strip. In an embodiment, the connecting portion is between respective end portions of the first thermal strip and the second thermal strip. In an embodiment, the connecting portion is between respective middle portions of the first thermal strip and the second thermal strip. In an embodiment, the semiconductor device further includes a second thermal fin extending through the semiconductor substrate, the dielectric layer, and the interconnect structure, a longitudinal axis of the second thermal fin being perpendicular to a longitudinal axis of the first thermal fin. In an embodiment, the semiconductor device further includes a thermally conductive feature extending over and being coupled with the first thermal fin and the second thermal fin. In an embodiment, the thermally conductive feature intersects with respective middle portions of the first thermal fin and the second thermal fin in a top view.

In accordance with another embodiment, a semiconductor device includes: a semiconductor substrate, the semiconductor substrate including circuitry; an interconnect structure over the semiconductor substrate; a through via (TV) extending into the semiconductor substrate and the interconnect structure, wherein the TV is electrically coupled to the circuitry of the semiconductor substrate through the interconnect structure; a first thermal fin extending into the semiconductor substrate and the interconnect structure, the first thermal fin being electrically isolated from the circuitry of the semiconductor substrate; a dielectric layer over the TV and the first thermal fin; and a thermal capping layer covering a portion of the first thermal fin, the thermal capping layer being in the dielectric layer. In an embodiment, the semiconductor device further includes a second thermal fin extending into the semiconductor substrate and the interconnect structure, wherein longitudinal axes of the first thermal fin and the second thermal fin are parallel. In an embodiment, the thermal capping extends over a respective middle portion of the second thermal fin. In an embodiment, respective end portions of the first thermal fin and the second thermal fin extend beyond a sidewall of the thermal capping layer. In an embodiment, the first thermal fin is a comb-like structure, the comb-like structure including a first finger-structure, a second finger-structure, and a connecting portion between the first finger-structure and the second finger-structure. In an embodiment, the thermal capping layer covers a middle portion of the comb-like structure. In an embodiment, the first thermal fin and the TV include a same conductive material and a same barrier layer.

In accordance with yet another embodiment, a method of manufacturing a semiconductor device includes: forming an interconnect structure over a substrate and an active device on a top surface of the substrate; forming a thermal fin through the interconnect structure, the thermal fin extending into the substrate, the thermal fin being electrically isolated from paths for electrical signals in the interconnect structure; depositing a dielectric layer over the thermal fin; and forming a thermally conductive feature in the dielectric layer, wherein the thermally conductive feature is coupled to the thermal fin. In an embodiment, the method further includes forming a through via (TV) through the interconnect structure, the TV extending into the substrate. In an embodiment, the thermal fin and the TV are formed in a same process.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   an integrated circuit structure, comprising:
      a semiconductor substrate comprising circuitry;
      a dielectric layer over the semiconductor substrate;
      an interconnect structure over the dielectric layer; and
      a first thermal fin extending through the semiconductor substrate, the dielectric layer, and the interconnect structure, the first thermal fin being electrically isolated from the circuitry; and
   a thermal pillar over the integrated circuit structure, wherein the thermal pillar is thermally coupled to the first thermal fin.

2. The semiconductor device of claim 1, wherein the thermal pillar is coupled to the first thermal fin through a conductive feature on a back side of the semiconductor substrate, wherein the back side is opposite the dielectric layer.

3. The semiconductor device of claim 1, further comprising a passivation layer over the interconnect structure, wherein the thermal pillar is coupled to the first thermal fin through a conductive feature over the passivation layer.

4. The semiconductor device of claim 1, further comprising a second thermal fin extending through the semiconductor substrate, the dielectric layer, and the interconnect structure, a longitudinal axis of the first thermal fin being parallel to a longitudinal axis of the second thermal fin.

5. The semiconductor device of claim 1, wherein the first thermal fin comprises a first thermal strip, a second thermal strip, and a connecting portion between the first thermal strip and the second thermal strip.

6. The semiconductor device of claim 5, wherein the connecting portion is between respective end portions of the first thermal strip and the second thermal strip.

7. The semiconductor device of claim 5, wherein the connecting portion is between respective middle portions of the first thermal strip and the second thermal strip.

8. The semiconductor device of claim 1, further comprising a second thermal fin extending through the semiconductor substrate, the dielectric layer, and the interconnect structure, a longitudinal axis of the second thermal fin being perpendicular to a longitudinal axis of the first thermal fin.

9. The semiconductor device of claim 8, further comprising a thermally conductive feature extending over and being coupled with the first thermal fin and the second thermal fin.

10. The semiconductor device of claim 9, wherein the thermally conductive feature intersects with respective middle portions of the first thermal fin and the second thermal fin in a top view.

11. A semiconductor device, comprising:
   a semiconductor substrate, the semiconductor substrate comprising circuitry;
   an interconnect structure over the semiconductor substrate;
   a through via (TV) extending into the semiconductor substrate and the interconnect structure, wherein the TV is electrically coupled to the circuitry of the semiconductor substrate through the interconnect structure;

a first thermal fin extending into the semiconductor substrate and the interconnect structure, the first thermal fin being electrically isolated from the circuitry of the semiconductor substrate;

a dielectric layer over the TV and the first thermal fin; and a thermal capping layer covering a portion of the first thermal fin, the thermal capping layer being in the dielectric layer.

12. The semiconductor device of claim 11, further comprising a second thermal fin extending into the semiconductor substrate and the interconnect structure, wherein longitudinal axes of the first thermal fin and the second thermal fin are parallel.

13. The semiconductor device of claim 12, wherein the thermal capping layer extends over a respective middle portion of the second thermal fin.

14. The semiconductor device of claim 12, wherein respective end portions of the first thermal fin and the second thermal fin extend beyond a sidewall of the thermal capping layer.

15. The semiconductor device of claim 11, wherein the first thermal fin is a comb-like structure, the comb-like structure comprising a first finger-structure, a second finger-structure, and a connecting portion between the first finger-structure and the second finger-structure.

16. The semiconductor device of claim 15, wherein the thermal capping layer covers a middle portion of the comb-like structure.

17. The semiconductor device of claim 11, wherein the first thermal fin and the TV comprise a same conductive material and a same barrier layer.

18. A method of manufacturing a semiconductor device, the method comprising:

forming an interconnect structure over a substrate and an active device on a top surface of the substrate;

forming a thermal fin through the interconnect structure, the thermal fin extending into the substrate, the thermal fin being electrically isolated from paths for electrical signals in the interconnect structure;

depositing a dielectric layer over the thermal fin; and forming a thermally conductive feature in the dielectric layer, wherein the thermally conductive feature is coupled to the thermal fin.

19. The method of claim 18, further comprising forming a through via (TV) through the interconnect structure, the TV extending into the substrate.

20. The method of claim 19, wherein the thermal fin and the TV are formed in a same process.

* * * * *